(12) United States Patent
Ogawa et al.

(10) Patent No.: US 8,404,603 B2
(45) Date of Patent: Mar. 26, 2013

(54) METHOD OF MANUFACTURING SEMICONDUCTOR DEVICE AND SUBSTRATE PROCESSING SYSTEM

(75) Inventors: Arito Ogawa, Toyama (JP); Sadayoshi Horii, Toyama (JP); Taketoshi Sato, Toyama (JP); Hideharu Itatani, Nanto (JP); Nobuyuki Mise, Kokubunji (JP); Osamu Tonomura, Odamara (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 60 days.

(21) Appl. No.: 12/825,012

(22) Filed: Jun. 28, 2010

(65) Prior Publication Data

US 2011/0003482 A1    Jan. 6, 2011

(30) Foreign Application Priority Data

Jul. 1, 2009   (JP) .................................. 2009-157235

(51) Int. Cl.
*H01L 21/31* (2006.01)
(52) U.S. Cl. ........................................................ 438/785
(58) Field of Classification Search .................... 438/128
See application file for complete search history.

(56) References Cited

U.S. PATENT DOCUMENTS

| 6,228,737 | B1 | 5/2001 | Inoue et al. | |
|---|---|---|---|---|
| 2002/0015855 | A1* | 2/2002 | Sajoto et al. | 428/639 |
| 2006/0134347 | A1* | 6/2006 | Chiruvolu et al. | 427/585 |
| 2006/0153995 | A1* | 7/2006 | Narwankar et al. | 427/569 |
| 2008/0087945 | A1* | 4/2008 | Forbes et al. | 257/325 |
| 2009/0195962 | A1* | 8/2009 | Lee et al. | 361/305 |

FOREIGN PATENT DOCUMENTS

| JP | 11-204757 | 7/1999 |
|---|---|---|
| JP | 2000-299444 | 10/2000 |
| JP | 2004-511909 | 4/2004 |
| JP | 2009-021608 | 1/2009 |
| KR | 1020050005726 | 1/2005 |
| KR | 1020070016071 | 2/2007 |
| WO | 0231875 A2 | 4/2002 |

OTHER PUBLICATIONS

JP 2004-511909 corresponds to WO 02/31875.
C. H. Lin et al "Microstructural Evolution of Metal-insulator-metal Capacitor prepared by atomic-layer-deposition System at Elevated Temperature", Japanese Journal of Applied Physics, Part 1, Apr. 25, 2006, vol. 45, 45, No. 4B, pp. 3036-3039.

* cited by examiner

*Primary Examiner* — Charles Garber
*Assistant Examiner* — Andre' C Stevenson
(74) *Attorney, Agent, or Firm* — Brundidge & Stanger, P.C.

(57) ABSTRACT

A method of manufacturing a semiconductor device. In the method, an aluminum-containing insulation film is formed on an electrode film of a substrate by alternately repeating a process of supplying an aluminum precursor into a processing chamber in which the substrate is accommodated and exhausting the aluminum precursor from the processing chamber and a process of supplying an oxidizing or nitriding precursor into the processing chamber and exhausting the oxidizing or nitriding precursor from the processing chamber; and a high permittivity insulation film different from the aluminum-containing insulation film is formed on the aluminum-containing insulation film by alternately repeating a process of supplying a precursor into the processing chamber and exhausting the precursor from the processing chamber and a process of supplying an oxidizing precursor into the processing chamber and exhausting the oxidizing precursor from the processing chamber. In addition, heat treatment is performed on the substrate.

20 Claims, 14 Drawing Sheets

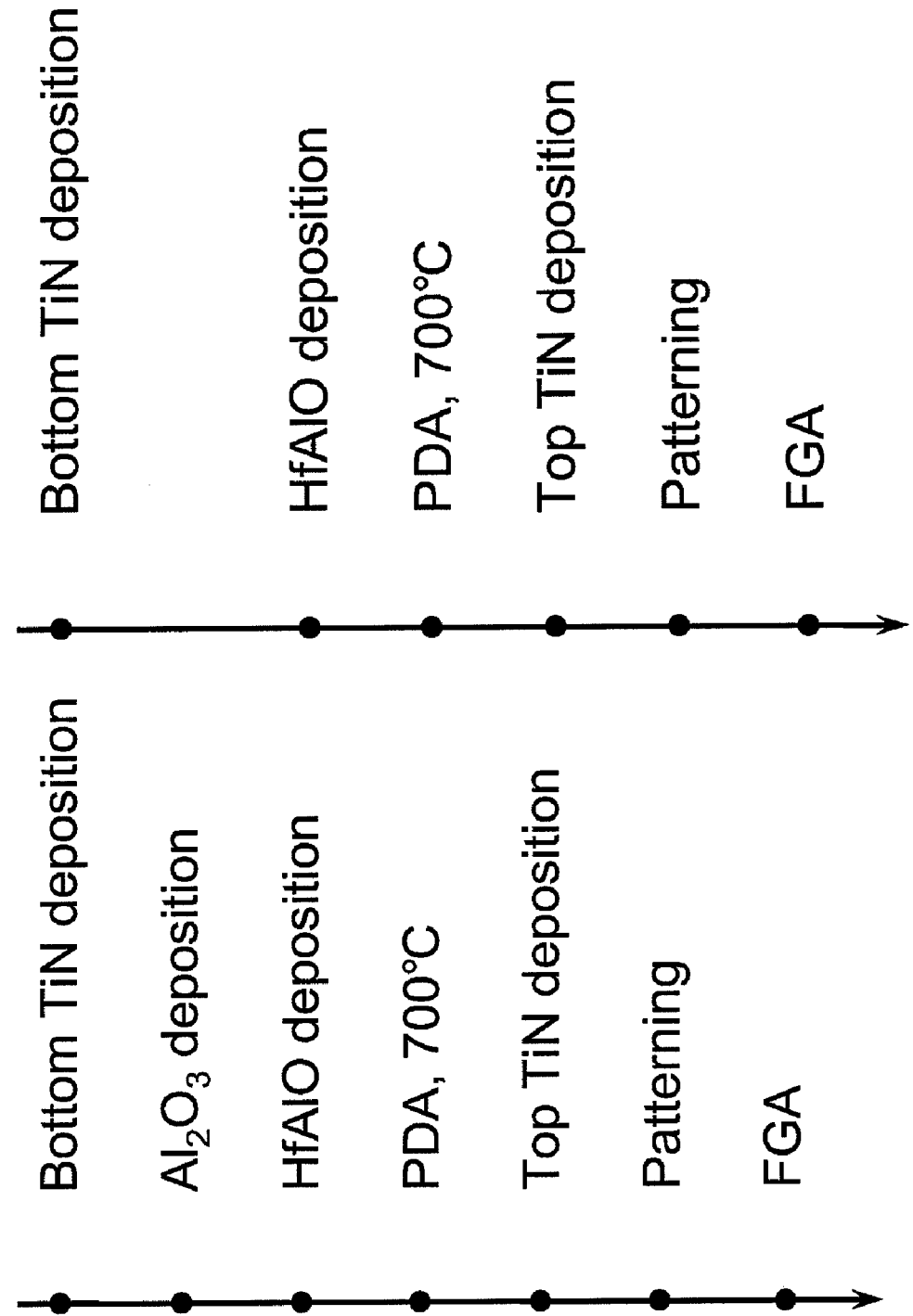

METHOD OF MANUFACTURING SEMICONDUCTOR DEVICE AND SUBSTRATE PROCESSING SYSTEM

CROSS-REFERENCE TO RELATED PATENT APPLICATION

This U.S. non-provisional patent application claims priority under 35 U.S.C. §119 of Japanese Patent Application No. 2009-157235, filed on Jul. 1, 2009, in the Japanese Patent Office, the entire contents of which are hereby incorporated by reference.

BACKGROUND OF THE INVENTION

1. Field of the Invention

The present invention relates to a method of manufacturing a semiconductor device and a substrate processing system.

2. Description of the Related Art

As metal-oxide-semiconductor field effect transistors (MOSFETs) become highly integrated and have high performance, the use of a high permittivity insulation film for gate insulation film is under investigation. In addition, for a capacitor of a dynamic random access memory (DRAM), a high permittivity insulation film such as a $HfO_2$ film or a $ZrO_2$ film having a relative permittivity in the range from, for example, about 15 to about 20 is used. Such a $HfO_2$ film or $ZrO_2$ film can be formed on a substrate accommodated in a processing chamber by alternately repeating a process of supplying a hafnium (He-containing or zirconium (Zr)-containing precursor into the processing chamber and exhausting the precursor from the processing chamber and a process of supplying an oxidizing precursor such as $O_3$ or $H_2O$ into the processing chamber and exhausting the oxidizing precursor from the processing chamber while heating the substrate accommodated in the processing chamber to a temperature of 200° C. or higher.

However, if $O_3$ is used as an oxidizing precursor, a metal film such as a bottom electrode disposed under the high permittivity insulation film may be oxidized. In addition, if $H_2O$ is used as an oxidizing precursor, OH which has not participated in a reaction may remain in the high permittivity insulation film. To prevent this, a heat treatment process may be performed to modify the high permittivity insulation film; however, in this case, OH remaining in the high permittivity insulation film may be released from the high permittivity insulation film to oxidize the metal film disposed under the high permittivity insulation film. For example, if the metal film is a TiN film, the TiN film may be oxidized to form a TiO(N) layer on the TiN film, and thus the electric capacitance of a capacitor may be reduced. Such problems occur remarkably when the high permittivity insulation film is made of a material having a very high oxygen permeability such as $HfO_2$ or $ZrO_2$ because the diffusion rate of oxygen in $HfO_2$ or $ZrO_2$ is high.

SUMMARY OF THE INVENTION

An object of the present invention is to provide a method of manufacturing a semiconductor device and a substrate processing system, for suppressing oxidation of a metal film disposed under a high permittivity insulation film when the high permittivity insulation film is formed.

According to an aspect of the present invention, there is provided a method of manufacturing a semiconductor device, the method including: alternately repeating: a process of supplying and exhausting an aluminum precursor into and from a processing chamber where the substrate is accommodated; and a process of supplying and exhausting one of an oxidizing precursor and a nitriding precursor into and from the processing chamber to form an aluminum-containing insulation film on an electrode film formed on a surface of a substrate; alternately repeating: a process of supplying and exhausting a precursor into and from the processing chamber; and a process of supplying and exhausting an oxidizing precursor into and from the processing chamber to forming a high permittivity insulation film different from the aluminum-containing insulation film on the aluminum-containing insulation film; and thermally diffusing aluminum in the aluminum-containing insulation film into the high permittivity insulation film so as to dope the high permittivity insulation film by subjecting the substrate having the high permittivity insulation film thereon to a heat treatment process.

According to another aspect of the present invention, there is provided a substrate processing system including a first processing unit and a second processing unit, wherein the first processing unit includes: a first processing chamber configured to process a substrate; an aluminum precursor supply system configured to supply an aluminum precursor into the first processing chamber; a first precursor supply system configured to supply a precursor into the first processing chamber; a second precursor supply system configured to supply one of an oxidizing precursor and a nitriding precursor into the first processing chamber; an exhaust system configured to exhaust an inside of the first processing chamber; and a controller configured to control the aluminum precursor supply system, the first precursor supply system, the second precursor supply system and the exhaust system, so as to: alternately repeat a process of supplying and exhausting the aluminum precursor into and from the first processing chamber where the substrate is accommodated and a process of supplying and exhausting one of the oxidizing precursor and the nitriding precursor into and from the first processing chamber to form an aluminum-containing insulation film on an electrode film formed on a surface of a substrate alternately repeat a process of supplying and exhausting a precursor into and from the first processing chamber and a process of supplying and exhausting an oxidizing precursor into and from the first processing chamber to form a high permittivity insulation film different from the aluminum-containing insulation film on the aluminum-containing insulation film, and wherein the second processing unit includes: a second processing chamber configured to process the substrate; a heater configured to heat the substrate accommodated in the second processing chamber; a controller configured to control the heater so as to thermally diffuse aluminum in the aluminum-containing insulation film into the high permittivity insulation film by subjecting the substrate having the high permittivity insulation film thereon to a heat treatment process so as to dope the high permittivity insulation film.

BRIEF DESCRIPTION OF THE DRAWINGS

FIG. 7A and FIG. 7B are schematic views illustrating a vertical processing furnace of a vertical atomic layer deposition (ALD) apparatus according to another embodiment of the present invention, in which FIG. 7A is a vertical sectional view illustrating the vertical processing furnace and FIG. 7B is a sectional view of the vertical processing furnace taken along line A-A of FIG. 7A.

FIG. 8A is a flowchart illustrating a substrate processing process for preparing an evaluation sample in an experimental example of the present invention, and FIG. 8B is a flowchart illustrating a substrate processing process for preparing an evaluation sample in a comparative example.

DETAILED DESCRIPTION OF THE PREFERRED EMBODIMENTS

Embodiment of Invention

Hereinafter, an embodiment of the present invention will now be described with reference to the attached drawings.

(1) Structure of Substrate Processing Apparatus

First, a substrate processing apparatus will be described according to an embodiment of the present invention.

Figure 6:
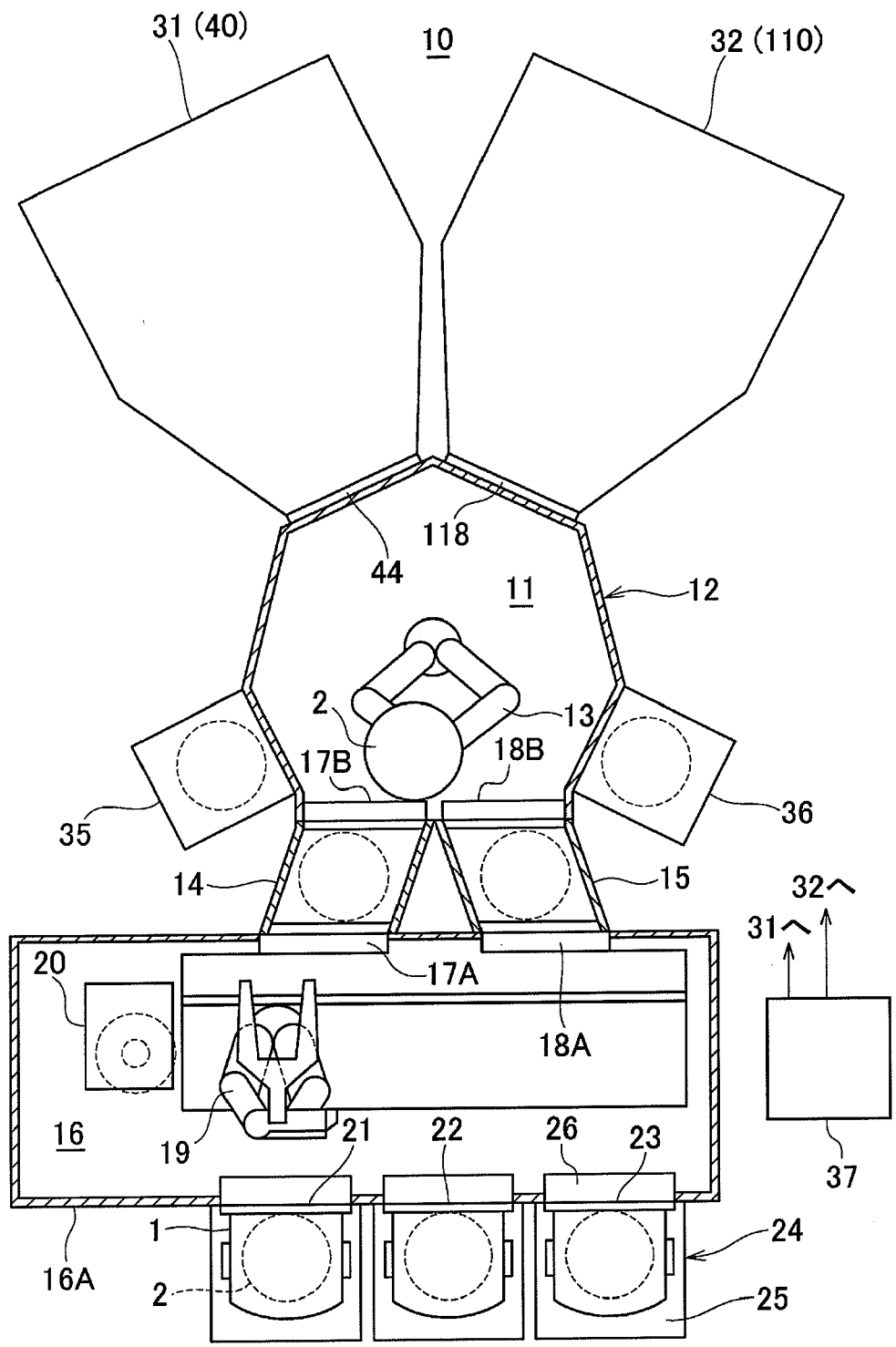
FIG. 6 is a schematic view illustrating the cluster apparatus according to an embodiment of the present invention.

The substrate processing apparatus which is a substrate processing system relevant to the current embodiment is configured as a cluster apparatus as shown in FIG. 6. In the cluster apparatus of the current embodiment, as wafer carrying carriers (substrate containers) configured to carry wafers 2, front opening unified pods (FOUPs) 1 (hereinafter referred to as pods 1) are used.

<Cluster Apparatus>

As shown in FIG. 6, a cluster apparatus 10 includes a first wafer transfer chamber 11 (hereinafter referred to as a negative pressure transfer chamber 11) as a transfer module (carrying chamber) configured to endure a pressure (negative pressure) lower than atmospheric pressure. When viewed from the top, a case 12 (hereinafter referred to as a negative pressure transfer chamber case 12) of the negative pressure transfer chamber 11 has a heptagonal box shape with closed top and bottom sides. The negative pressure transfer chamber case 12 is configured as a carrying vessel (airtight vessel). At the center part of the negative pressure transfer chamber 11, a wafer transfer machine 13 (hereinafter referred to as a negative pressure transfer machine 13) is installed as a carrying robot configured to transfer a wafer 2 under a negative pressure condition.

As loadlock modules (loadlock chambers), a carrying-in preliminary chamber 14 (hereinafter referred to as a carrying-in chamber 14) and a carrying-out preliminary chamber 15 (hereinafter referred as a carrying-out chamber 15) are closely disposed and connected to the biggest sidewall (front wall) of the seven sidewalls of the negative pressure transfer chamber case 12. When viewed from the top, each of a case of the carrying-in chamber 14 and a case of the carrying-out chamber 15 is formed in an approximately rhombic shape with closed top and bottom sides and is configured as a loadlock chamber capable of enduring a negative pressure condition.

A second wafer transfer chamber 16 (hereinafter referred to as a positive pressure transfer chamber 16), which is a front end module configured to be kept at a pressure equal to or higher than atmospheric pressure (hereinafter referred to as a positive pressure), is connected to sides of the carrying-in chamber 14 and the carrying-out chamber 15 opposite to the negative pressure transfer chamber 11. When viewed from the top, a case of the positive pressure transfer chamber 16 has a horizontally elongated rectangular shape with closed top and bottom sides. Between the carrying-in chamber 14 and the positive pressure transfer chamber 16, a gate valve 17A is installed, and between the carrying-in chamber 14 and the negative pressure transfer chamber 11, a gate valve 17B is installed. Between the carrying-out chamber 15 and the positive pressure transfer chamber 16, a gate valve 18A is installed, and between the carrying-out chamber 15 and the negative pressure transfer chamber 11, a gate valve 18B is installed. In the positive pressure transfer chamber 16, a second wafer transfer machine 19 (hereinafter referred to as a positive pressure transfer machine 19) is installed as a carrying robot configured to transfer a wafer 2 under a positive pressure condition. The positive pressure transfer machine 19 is configured to be moved upward and downward by an elevator installed at the positive pressure transfer chamber 16, and is also configured to reciprocate left and right by a linear actuator. At the left end part of the positive pressure transfer chamber 16, a notch aligning device 20 is installed.

At the front wall of the positive pressure transfer chamber 16, three wafer carrying entrances 21, 22, and 23 are formed in a closed arranged fashion. The wafer carrying entrances 21, 22, and 23 are configured so that wafers 2 can be carried into and out of the positive pressure transfer chamber 16 through the wafer carrying entrances 21, 22, and 23. Pod openers 24 are installed at the wafer carrying entrances 21, 22, and 23, respectively. Each of the pod openers 24 includes a stage 25 on which a pod 1 can be placed, and a cap attachment/detachment mechanism 26 configured to attach and detach a cap of a pod 1 placed on the stage 25. By attaching or detaching a cap of a pod 1 placed on the stage 25 using the pod opener 24, a wafer taking in/out entrance of the pod 1 can be closed or opened. Pods 1 are supplied to the stages 25 of the pod openers 24 and taken away from the stages 25 of the pod openers 24 by an in-process carrying device (such as a rail guided vehicle, RGV).

As shown in FIG. 6, as processing modules, a first processing unit 31 (high permittivity insulation film forming unit 31) and a second processing unit 32 (heat treatment unit 32) are closely disposed and respectively connected to two sidewalls (rear walls) of the seven sidewalls of the negative pressure transfer chamber case 12 opposite to the positive pressure transfer chamber 16. Between the first processing unit 31 and the negative pressure transfer chamber 11, a gate valve 44 is installed. Between the second processing unit 32 and the negative pressure transfer chamber 11, a gate valve 118 is installed. In addition, as cooling stages, a first cooling unit 35 and a second cooling unit 36 are respectively connected to two other sidewalls of the seven sidewalls of the negative pressure transfer chamber case 12 that face the positive pressure transfer chamber 16. Each of the first and second cooling units 35 and 36 is used as a cooling chamber for cooling a processed wafer 2.

The cluster apparatus 10 includes a main controller 37 for overall controlling of a substrate processing flow (described later). The main controller 37 controls each part of the cluster apparatus 10.

<First Processing Unit>

Figure 3:
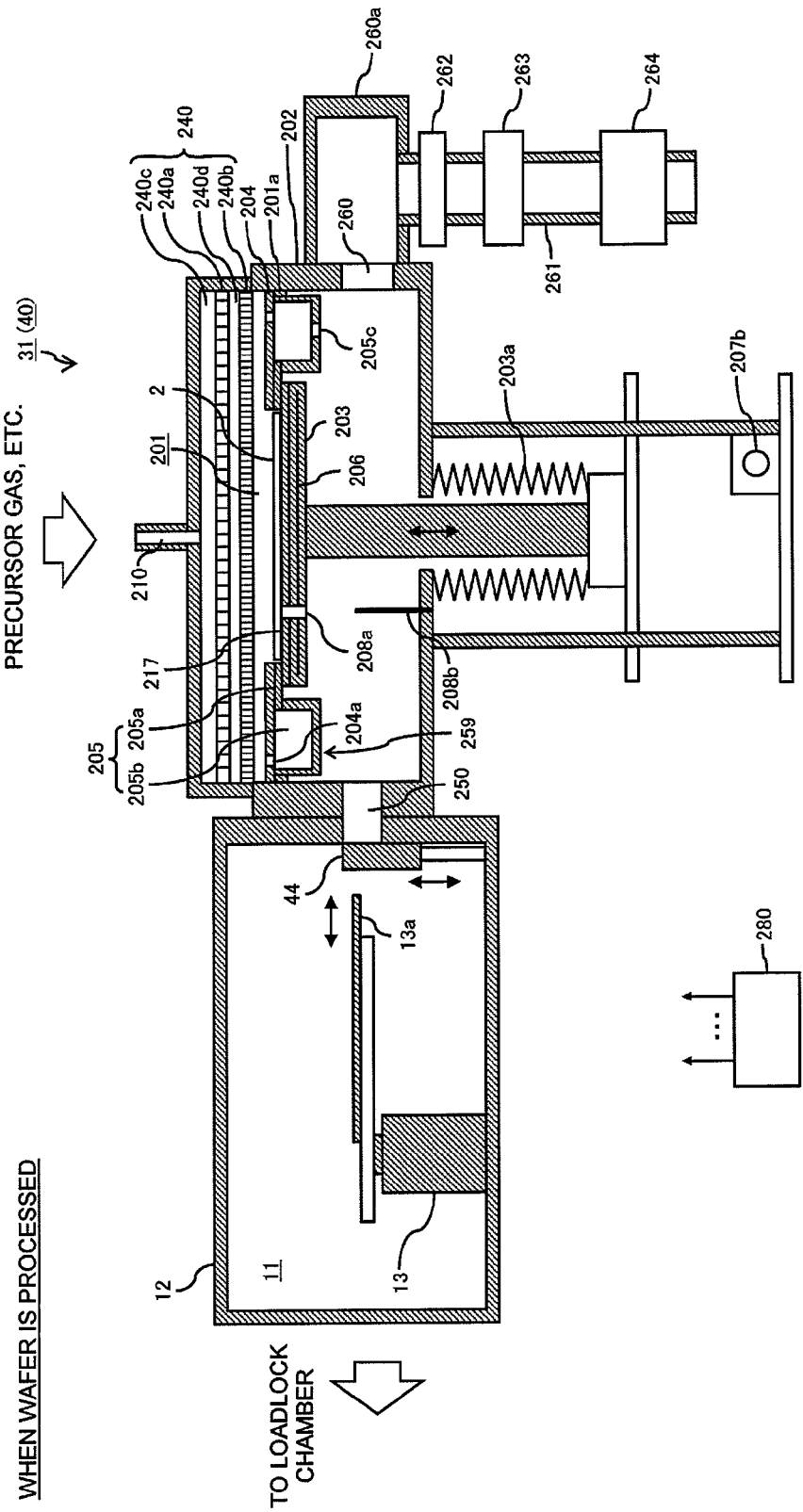
FIG. 3 is a sectional view illustrating the first processing unit (high permittivity insulation film forming unit) of the cluster apparatus when a wafer is processed according to an embodiment of the present invention.
Figure 4:
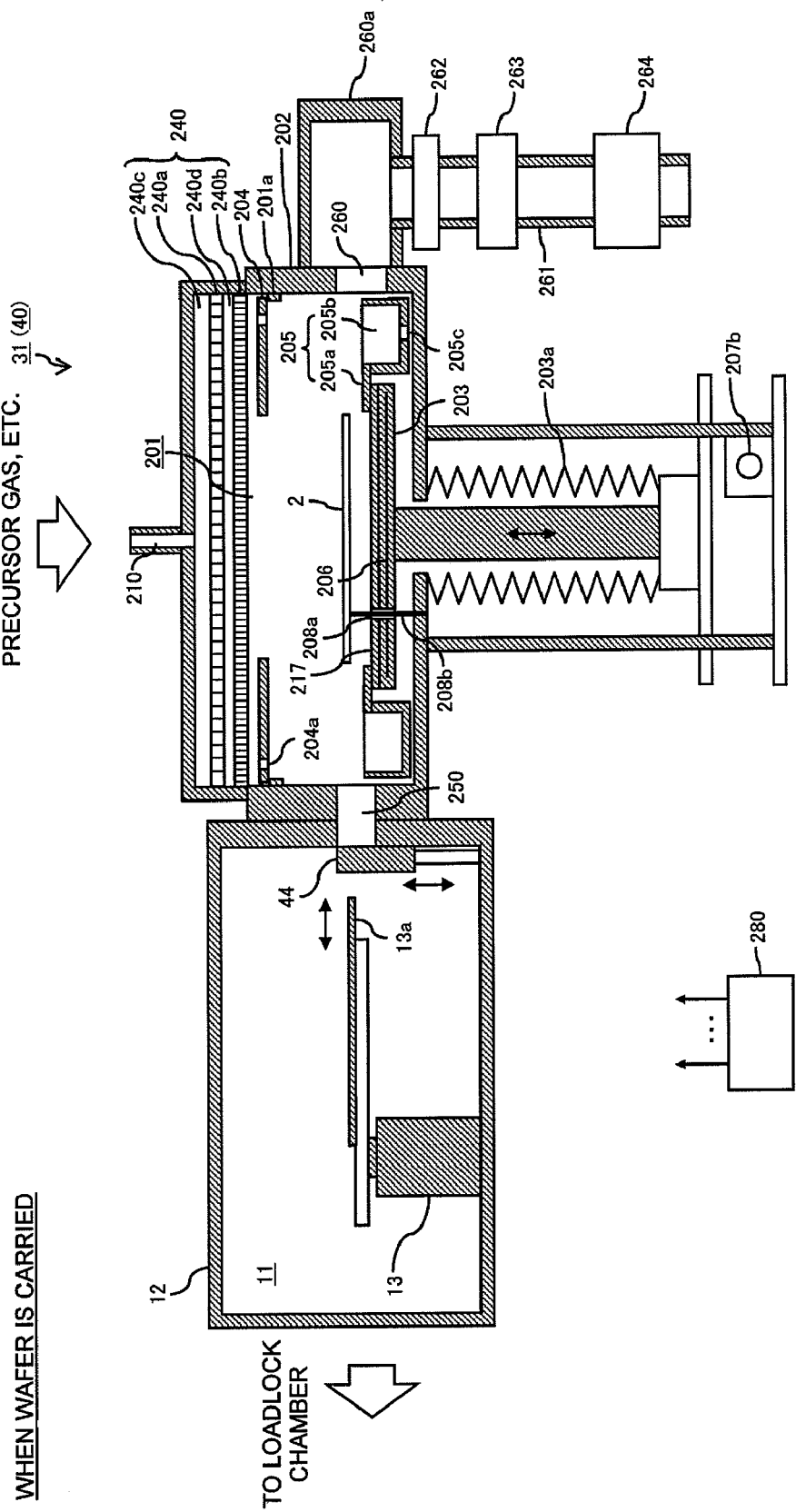
FIG. 4 is a sectional view illustrating the first processing unit (high permittivity insulation film forming unit) of the cluster apparatus when a wafer is carried according to an embodiment of the present invention.

Next, an explanation will be given on the first processing unit 31 of the cluster apparatus 10 according to the current embodiment. The first processing unit 31 is a high permittivity insulation film forming unit, and as shown in FIG. 3 and FIG. 4, the first processing unit 31 is configured as a single wafer type cold wall substrate processing apparatus. Functionally, the first processing unit 31 is configured as an atomic layer deposition (ALD) apparatus 40 (hereinafter referred to as a film forming apparatus 40). Hereinafter, the structure of the film forming apparatus 40 will be described with reference to FIG. 3 and FIG. 4. FIG. 3 is a sectional view illustrating the film forming apparatus 40 when a wafer 2 is processed, and FIG. 4 is a sectional view illustrating the film forming apparatus 40 when a wafer 2 is carried.

As shown in FIG. 3 and FIG. 4, the film forming apparatus 40 includes a processing vessel 202. For example, the processing vessel 202 is a flat airtight vessel having a circular cross sectional shape. In addition, the processing vessel 202 is made of a metal material such as aluminum (Al) or stainless steel (e.g., SUS described in the Japanese industrial standard). In the processing vessel 202, a processing chamber 201 is formed to process a substrate such as a wafer 2 (e.g., a silicon wafer).

In the processing chamber 201, a support stage 203 is installed to support a wafer 2. On the top surface of the support stage 203 that makes direct contact with the wafer 2, a susceptor 217 made of a material such as quartz ($SiO_2$), carbon, a ceramic material, silicon carbide (SiC), aluminum oxide ($Al_2O_3$), or aluminum nitride (AlN) is installed as a support plate.

In the support stage 203, a heater 206 is built as a heating unit (heating source) to heat the wafer 2. The lower end part of the support stage 203 penetrates the bottom side of the processing vessel 202.

At the outside of the processing chamber 201, an elevating mechanism 207b is installed to elevate the support stage 203. By operating the elevating mechanism 207b to lift and lower the support stage 203, the wafer 2 supported on the susceptor 217 can be lifted and lowered. When the wafer 2 is carried, the support stage 203 is lowered to a position (wafer carrying position) shown in FIG. 4, and when the wafer 2 is processed, the support stage 203 is raised to a position (wafer processing position) shown in FIG. 3. The lower end part of the support stage 203 is surrounded by a bellows 203a so that the inside of the processing chamber 201 can be hermetically maintained.

In addition, on the bottom surface (floor surface) of the processing chamber 201, for example, three lift pins 208b are installed in a manner such that the lift pins 208b are vertically erected. Furthermore, in the support stage 203 (including the susceptor 217), penetration holes 208a are respectively formed at positions corresponding to the lift pins 208b so that the lift pins 208b can be inserted through the penetration holes 208a. Therefore, when the support stage 203 is lowered to the wafer carrying position, as shown in FIG. 4, upper parts of the lift pins 208b protrude from the top surface of the susceptor 217 so that the lift pins 208b can support the wafer 2 from the bottom side of the wafer 2. In addition, when the support stage 203 is raised to the wafer processing position, as shown in FIG. 3, the lift pins 208b are retracted from the top surface of the susceptor 217 so that the susceptor 217 can support the wafer 2 from the bottom side of the wafer 2. Since the lift pins 208b make direct contact with the wafer 2, it is preferable that the lift pins 208b be made of a material such as quartz or alumina.

(Wafer Carrying Entrance)

At a side of the inner wall of the processing chamber 201 (processing vessel 202), a wafer carrying entrance 250 is installed so that a wafer 2 can be carried into and out of the processing chamber 201 through wafer carrying entrance 250. At the wafer carrying entrance 250, the gate valve 44 is installed so that the inside of the processing chamber 201 can communicate with the inside of the negative pressure transfer chamber 11 by opening the gate valve 44. As described above, the negative pressure transfer chamber 11 is formed in the negative pressure transfer chamber case 12, and the negative pressure transfer machine 13 is installed in the negative pressure transfer chamber case 12. The negative pressure transfer machine 13 includes a carrying arm 13a configured to support a wafer 2 when carrying the wafer 2. In a state where the support stage 203 is lowered to the wafer carrying position, the gate valve 44 is opened, and then the negative pressure transfer machine 13 can transfer a wafer 2 between the inside of the processing chamber 201 and the inside of the negative pressure transfer chamber 11. A wafer 2 carried into the processing chamber 201 is temporarily placed on the lift pins 208b as described above.

(Exhaust System)

At a side of the inner wall of the processing chamber 201 (processing vessel 202) opposite to the wafer carrying entrance 250, an exhaust outlet 260 is installed for exhausting the inside atmosphere of the processing chamber 201. An exhaust pipe 261 is connected to the exhaust outlet 260 through an exhaust chamber 260a, and at the exhaust pipe 261, a pressure regulator 262 such as an auto pressure controller (APC) configured to control the inside pressure of the processing chamber 201, a precursor collection trap 263, and a vacuum pump 264 are sequentially connected in series. An exhaust system (exhaust line) is constituted mainly by the exhaust outlet 260, the exhaust chamber 260a, the exhaust pipe 261, the pressure regulator 262, the precursor collection trap 263, and the vacuum pump 264.

(Gas Inlet)

At the top surface (the ceiling wall) of a later-described shower head 240 installed at an upper part of the processing chamber 201, a gas inlet 210 is installed to introduce various gases into the processing chamber 201. A gas supply system connected to the gas inlet 210 will be described later.

(Shower Head)

Between the gas inlet 210 and the processing chamber 201, the shower head 240 is installed as a gas distributing mechanism. The shower head 240 includes a distributing plate 240a configured to distribute a gas introduced through the gas inlet 210, and a shower plate 240b configured to distribute the gas passing through the distributing plate 240a more uniformly and supply the gas to the surface of a wafer 2 placed on the support stage 203. A plurality of ventilation holes are formed in the distributing plate 240a and the shower plate 240b. The distributing plate 240a is disposed to face the top surface of the shower head 240 and the shower plate 240b, and the shower plate 240b is disposed to face the wafer 2 placed on the support stage 203. In addition, spaces are formed between the top surface of the shower head 240 and the distributing plate 240a and between the distributing plate 240a and the shower plate 240b, respectively. The spaces function as a first buffer space (distributing chamber) 240c through which gas supplied through the gas inlet 210 is distributed and a second buffer space 240d through which gas passing through the distributing plate 240a is diffused.

(Exhaust Duct)

On the side surface of the inner wall of the processing chamber 201, a stopper 201a is installed. The stopper 201a is configured to hold a conductance plate 204 at a position close to the wafer processing position. The conductance plate 204 is a doughnut-shaped (ring-shaped) circular disk having an opening to accommodate the wafer 2 along its inner circumferential part. A plurality of discharge outlets 204a are formed in the outer circumferential part of the conductance plate 204 in a manner such that the discharge outlets 204a are arranged at predetermined intervals in the circumferential direction of the conductance plate 204. The discharge outlets 204a are discontinuously formed so that the outer circumferential part of the conductance plate 204 can support the inner circumferential part of the conductance plate 204.

A lower plate 205 latches onto the outer circumferential part of the support stage 203. The lower plate 205 includes a ring-shaped concave part 205b and a flange part 205a formed in one piece with the inner upper side of the concave part 205b. The concave part 205b is installed to close a gap between the outer circumferential part of the support stage 203 and the side surface of the inner wall of the processing chamber 201. At a part of the lower side of the concave part 205b close to the exhaust outlet 260, a plate exhaust outlet 205c is formed to discharge (distribute) gas from the inside of the concave part 205b toward the exhaust outlet 260. The flange part 205a functions as a latching part that latches onto the upper outer circumferential part of the support stage 203. Since the flange part 205a latches onto the upper outer circumferential part of the support stage 203, the lower plate 205 can be lifted together with the support stage 203 when the support stage 203 is lifted.

When the support stage 203 is raised to the wafer processing position, the lower plate 205 is also raised to the wafer processing position. As a result, the top surface of the concave part 205b is blocked by the conductance plate 204 held at a position close to the wafer processing position, and thus a gas flow passage region is formed in the concave part 205b as an exhaust duct 259. At this time, by the exhaust duct 259 (the conductance plate 204 and the lower plate 205) and the support stage 203, the inside of the processing chamber 201 is divided into an upper processing chamber higher than the exhaust duct 259 and a lower processing chamber lower than the exhaust duct 259. Preferably, the conductance plate 204 and the lower plate 205 may be formed of a material that can be held at a high temperature, for example, high temperature resistant and high load resistant quartz.

An explanation will now be given on a gas flow in the processing chamber 201 during a wafer processing process. First, a gas supplied from the gas inlet 210 to the upper side of the shower head 240 flows from the first buffer space (distributing chamber) 240c to the second buffer space 240d through the plurality of holes of the distributing plate 240a, and is then supplied to the inside of the processing chamber 201 through the plurality of holes of the shower plate 240b, so that the gas can be uniformly supplied to the wafer 2. Then, the gas supplied to the wafer 2 flows outward in the radial directions of the wafer 2. After the gas makes contact with the wafer 2, remaining gas is discharged to the exhaust duct 259 disposed at the outer circumference of the wafer 2: that is, the remaining gas flows outward on the conductance plate 204 in the radial directions of the wafer 2 and is discharged to the gas flow passage region (the inside of the concave part 205b) of the exhaust duct 259 through the discharge outlets 204a formed in the conductance plate 204. Thereafter, the gas flows in the exhaust duct 259 and is exhaust to the exhaust outlet 260 through the plate exhaust outlet 205c. Since gas is directed to flow in this manner, the gas can be prevented from flowing to the lower part of the processing chamber 201, that is, the rear side of the support stage 203 or the bottom side of the processing chamber 201.

Figure 1:
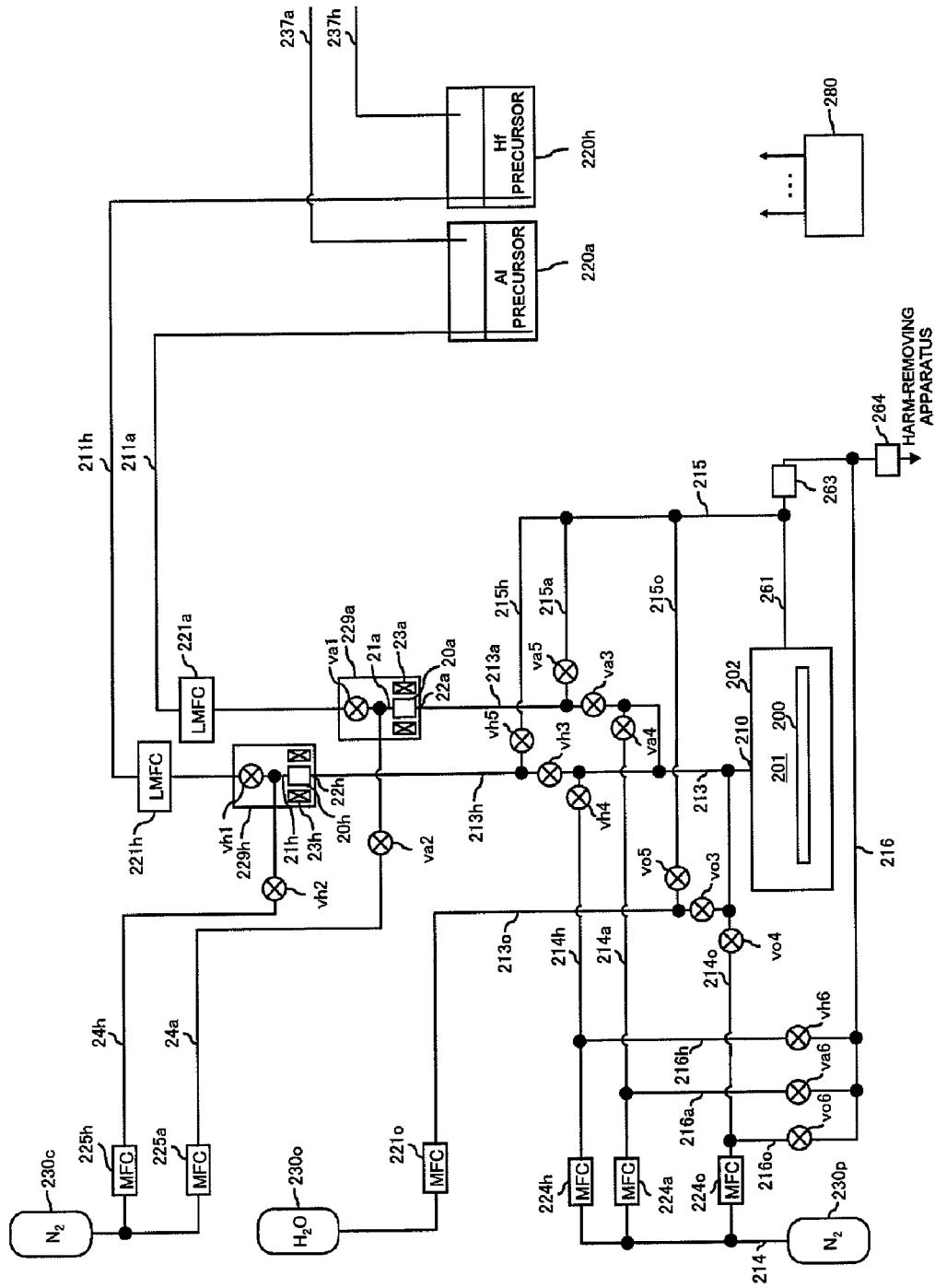
FIG. 1 is a schematic view illustrating a gas supply system and a gas exhaust system of a first processing unit (high permittivity insulation film forming unit) of a cluster apparatus according to an embodiment of the present invention.

Next, the configuration of the gas supply system connected to the gas inlet 210 will be described with reference to FIG. 1. FIG. 1 is a schematic view illustrating the gas supply system and a gas exhaust system of the film forming apparatus 40 according to an embodiment of the present invention.

(Liquid precursor supply system)

At the outside of the processing chamber 201, a first liquid precursor supply source 220h is installed to supply a first liquid precursor such as a Hf (hafnium)-containing organic metal liquid precursor (hereinafter also referred to as a Hf precursor), and a second liquid precursor supply source 220a is installed to supply a second liquid precursor such as an Al (aluminum)-containing organic metal liquid precursor (hereinafter also referred to as an Al precursor). Each of the first liquid precursor supply source 220h and the second liquid precursor supply source 220a is configured as a tank (sealed reservoir) in which a liquid precursor can be contained (filled).

A pressurizing gas supply pipe 237h and a pressurizing gas supply pipe 237a are connected to the first liquid precursor supply source 220h and the second liquid precursor supply source 220a, respectively. Pressurizing gas supply sources (not shown) are connected to the upstream end parts of the pressurizing gas supply pipe 237h and the pressurizing gas supply pipe 237a. The downstream end parts of the pressurizing gas supply pipe 237h and the pressurizing gas supply pipe 237a are connected to the upper inner spaces of the first and second liquid precursor supply sources 220h and 220a so that pressurizing gas can be supplied to the upper inner spaces. Preferably, gas that does not react with the liquid precursors is used as the pressurizing gas. For example, inert gas such as $N_2$ gas is used as the pressurizing gas.

In addition, a first liquid precursor supply pipe 211h and a second liquid precursor supply pipe 211a are connected to the first liquid precursor supply source 220h and the second liquid precursor supply source 220a, respectively. The upstream end parts of the first and second liquid precursor supply pipes 211h and 211a are placed in the liquid precursors contained in the first and second liquid precursor supply sources 220h and 220a. In addition, the downstream end parts of the first and second liquid precursor supply pipes 211h and 211a are respectively connected to vaporizers 229h and 229a which are vaporizing units configured to vaporize the liquid precursors. Furthermore, at the first and second liquid precursor supply pipes 211h and 211a, liquid mass flow controllers (LMFCs) 221h and 221a are installed as flow rate controllers for controlling the supply flow rates of the liquid precursors, and valves vh1 and va1 are installed to control supply of the liquid precursors. The valves vh1 and va1 are installed in the vaporizers 229h and 229a.

In the above-described structure, by opening the valves vh1 and va1 and simultaneously supplying pressurizing gas through the pressurizing gas supply pipes 237h and 237a, the liquid precursors can be pressurized (supplied) from the first and second liquid precursor supply sources 220h and 220a to the vaporizers 229h and 229a. A first liquid precursor supply system (first liquid precursor supply line) is constituted mainly by the first liquid precursor supply source 220h, the pressurizing gas supply pipe 237h, the liquid precursor supply pipe 211h, the LMFC 221h, and the valve vh1. A second liquid precursor supply system (second liquid precursor supply line) is constituted mainly by the second liquid precursor supply source 220a, the pressurizing gas supply pipe 237a, the second liquid precursor supply pipe 211a, the LMFC 221a, and the valve va1.

(Vaporizing Units)

The vaporizers 229h and 229a, which are vaporizing units configured to vaporize the liquid precursors, respectively include: vaporizing chambers 20h and 20a in which precursor gases are generated by vaporizing the liquid precursors using heaters 23h and 23a; liquid precursor flow passages 21h and 21a as flow passages through which the liquid precursors are discharged into the vaporizing chambers 20h and 20a; the valves vh1 and va1 for controlling supply of the liquid precursors into the vaporizing chambers 20h and 20a; and precursor gas supply outlets 22h and 22a through which precursor gases generated in the vaporizing chambers 20h and 20a are supplied to first and second precursor gas supply pipes 213h and 213a (described later). The downstream end parts of the first and second liquid precursor supply pipe 211h and 211a are connected to the upstream end parts of the liquid precursor flow passages 21h and 21a through the valves vh1 and va1. The downstream end parts of carrier gas supply pipes 24h and 24a are connected to the liquid precursor flow passages 21h and 21a so as to supply carrier gas from the carrier gas supply pipes 24h and 24a to the vaporizing chambers 20h and 20a through the liquid precursor flow passages 21h and 21a. The upstream end parts of the carrier gas supply pipes 24h and 24a are connected to a $N_2$ gas supply source 230c that supplies $N_2$ gas as a carrier gas. At the carrier gas supply pipes 24h and 24a, mass flow controllers (MFCs) 225h and 225a are installed as flow rate controllers for controlling the supply flow rates of $N_2$ gas, and valves vh2 and va2 are installed to control supply of the $N_2$ gas. A carrier gas supply system (carrier gas supply line) is constituted mainly by the $N_2$ gas supply source 230c, the carrier gas supply pipes 24h and 24a, the MFCs 225h and 225a, and the valves vh2 and va2. The vaporizers 229h and 229a are configured as first and second vaporizing units, respectively.

(Precursor Gas Supply System)

The upstream end parts of the first and second precursor gas supply pipes 213h and 213a are respectively connected to the precursor gas supply outlets 22h and 22a of the vaporizers 229h and 229a to supply precursor gases to the inside of the processing chamber 201. The downstream end parts of the first and second precursor gas supply pipes 213h and 213a are joined together as a precursor gas supply pipe 213, and the precursor gas supply pipe 213 is connected to the gas inlet 210. At the first and second precursor gas supply pipes 213h and 213a, valves vh3 and va3 are respectively installed to control supply of precursor gases into the processing chamber 201.

In the above-described structure, the liquid precursors are vaporized in the vaporizers 229h and 229a to generate precursor gases, and the valves vh3 and va3 are simultaneously opened, so that the precursor gases can be supplied from the first and second precursor gas supply pipes 213h and 213a to the inside of the processing chamber 201 through the precursor gas supply pipe 213. A first precursor gas supply system (first precursor gas supply line) is constituted mainly by the first precursor gas supply pipe 213h and the valve vh3, and a second precursor gas supply system (second precursor gas supply line) is constituted mainly by the second precursor gas supply pipe 213a and the valve va3. In addition, a first precursor supply system (Hf precursor supply system) is constituted mainly by the first liquid precursor supply system, the first vaporizing unit, and the first precursor gas supply system, and a second precursor supply system (Al precursor supply system) is constituted mainly by the second liquid precursor supply system, the second vaporizing unit, and the second precursor gas supply system.

(Oxidizing Precursor Supply System)

In addition, at the outside of the processing chamber 201, an $H_2O$ gas supply source 230o is installed to supply vapor ($H_2O$ gas) as an oxidizing precursor (oxidizing gas). The upstream end part of a $H_2O$ gas supply pipe 213o is connected to the $H_2O$ gas supply source 230o. At the $H_2O$ gas supply pipe 213o, an MFC 221o is installed as a flow rate controller for controlling the supply flow rate of $H_2O$ gas.

The downstream end part of the $H_2O$ gas supply pipe 213o is connected to the precursor gas supply pipe 213. That is, the $H_2O$ gas supply pipe 213o is configured to supply $H_2O$ gas into the processing chamber 201 as an oxidizing precursor. In addition, at the $H_2O$ gas supply pipe 213o, a valve vo3 is installed to control supply of $H_2O$ gas into the processing chamber 201.

In the above-described structure, $H_2O$ gas may be supplied into the processing chamber 201 as an oxidizing precursor by opening the valve vo3 while controlling the flow rate of the $H_2O$ gas by using the MFC 221o. An oxidizing precursor supply system (oxidizing precursor supply line) is constituted mainly by the $H_2O$ gas supply source 230o, the $H_2O$ gas supply pipe 213o, the MFC 221o, and the valve vo3. In the case of using a nitriding precursor such as ammonia ($NH_3$) gas instead of using an oxidizing precursor, the $H_2O$ gas supply source 230o and the $H_2O$ gas supply pipe 213o may be changed to a $NH_3$ gas supply source 230o and a $NH_3$ gas supply pipe 213o. In this case, a nitriding precursor supply system (nitriding precursor supply line) is constituted mainly by the $NH_3$ gas supply source 230o, the $NH_3$ gas supply pipe 213o, the MFC 221o, and the valve vo3.

(Purge Gas Supply System)

In addition, at the outside of the processing chamber 201, a $N_2$ gas supply source 230p is installed to supply $N_2$ gas as a purge gas. The upstream end part of a purge gas supply pipe 214 is connected to the $N_2$ gas supply source 230p. The downstream end part of the purge gas supply pipe 214 branches into three lines: a first purge gas supply pipe 214h, a second purge gas supply pipe 214a, a third purge gas supply pipe 214o. The downstream end parts of the first to third purge gas supply pipes 214h, 214a, and 214o are connected to the downstream sides of the valves vh3, va3, and vo3 of the first precursor gas supply pipe 213h, the second precursor gas supply pipe 213a, and the $H_2O$ gas supply pipe 213o, respectively. At the first to third purge gas supply pipes 214h, 214a, and 214$o$, MFCs 224$h$, 224$a$, and 224$o$ are respectively installed as flow rate controllers for controlling the supply flow rates of N$_2$ gas, and valves vh4, va4, and vo4 are respectively installed to control supplies of N$_2$ gas. A purge gas supply system (purge gas supply line) is constituted mainly by the N$_2$ gas supply source 230$p$, the purge gas supply pipe 214, the first purge gas supply pipe 214$h$, the second purge gas supply pipe 214$a$, the third purge gas supply pipe 214$o$, the MFCs 224$h$, 224$a$, and 224$o$, and the valves vh4, va4, and vo4.

(Vent Gas Supply System)

In addition, the upstream end parts of first to third vent pipes 215$h$, 215$a$, and 215$o$ are connected to the upstream sides of the valves vh3, va3, and vo3 of the first precursor gas supply pipe 213$h$, the second precursor gas supply pipe 213$a$, and the H$_2$O gas supply pipe 213$o$, respectively. Furthermore, the downstream end parts of the first to third vent pipes 215$h$, 215$a$, and 215$o$ are joined together into a vent pipe 215, and the vent pipe 215 is connected to the upstream side of the precursor collection trap 263 of the exhaust pipe 261. At the first to third vent pipes 215$h$, 215$a$, and 215$o$, valves vh5, va5, and vo5 are respectively installed to control supply of gases.

In the above-described structure, by closing the valves vh3, va3, and vo3 and opening the valves vh5, va5, and vo5, gases flowing in the first precursor gas supply pipe 213$h$, the second precursor gas supply pipe 213$a$, and the H$_2$O gas supply pipe 213$o$ can be bypassed to the outside of the processing chamber 201 without supplying the gases into the processing chamber 201.

In addition, fourth to sixth vent pipes 216$h$, 216$a$, and 216$o$ are respectively connected to the downstream sides of the MFCs 224$h$, 224$a$, and 224$o$ which are located at the upstream sides of the valves vh4, va4, and vo4 of the first to third purge gas supply pipes 214$h$, 214$a$, and 214$o$. The downstream sides of the fourth to sixth vent pipes 216$h$, 216$a$, and 216$o$ are joined together as a vent pipe 216. The vent pipe 216 is connected to the downstream side of the precursor collection trap 263 of the exhaust pipe 261 but the upstream side of the vacuum pump 264. At the fourth to sixth vent pipes 216$h$, 216$a$, and 216$o$, valves vh6, va6, and vo6 are respectively installed to control supply of gas.

In the above-described structure, by closing the valves vh4, va4, and vo4 and opening the valves vh6, va6, and vo6, N$_2$ gas flowing in the first to third purge gas supply pipes 214$h$, 214$a$, and 214$o$ can be bypassed to the outside of the processing chamber 201 without supplying the N$_2$ gas into the processing chamber 201. In the case where the valves vh3, va3, and vo3 are closed and the valves vh5, va5, and vo5 are opened so as to bypass gases flowing in the first precursor gas supply pipe 213$h$, the second precursor gas supply pipe 213$a$, and the H$_2$O gas supply pipe 213$o$ to the outside of the processing chamber 201 without supplying the gases into the processing chamber 201, the valves vh4, va4, and vo4 are opened to introduce N$_2$ gas into the first precursor gas supply pipe 213$h$, the second precursor gas supply pipe 213$a$, and the H$_2$O gas supply pipe 213$o$ for purging the insides of the supply pipes 213$h$, 213$a$, and 213$o$. In addition, the valves vh6, va6, and vo6 are set to be operated in reverse to the valves vh4, va4, and vo4 so that when N$_2$ gas is not supplied into the precursor gas supply pipes 213$h$, 213$a$, and 213$o$, the N$_2$ gas can be exhausted by bypassing the processing chamber 201. A vent system (vent lines) is constituted mainly by the first vent pipe 215$h$; the second vent pipe 215$a$; the third vent pipe 215$o$; the vent pipe 215; the fourth vent pipe 216$h$; the fifth vent pipe 216$a$; the sixth vent pipe 216$o$; the vent pipe 216; the valves vh5, va5, and vo5; and the valves vh6, va6, and vo6.

(Controller)

The film forming apparatus 40 includes a controller 280 configured to control each part of the film forming apparatus 40. Under the control of the main controller 37, the controller 280 controls operations of parts such as the gate valve 44, the elevating mechanism 207$b$, the negative pressure transfer machine 13, the heater 206, the pressure regulator (APC) 262, the vaporizers 229$h$ and 229$a$, the vacuum pump 264, the valves vh1 to vh6, va1 to va6, and vo3 to vo6, the LMFCs 221$h$ and 221$a$, and the MFCs 225$h$, 225$a$, 221$o$, 224$h$, 224$a$, and 224$o$.

<Second Processing Unit>

Figure 5:
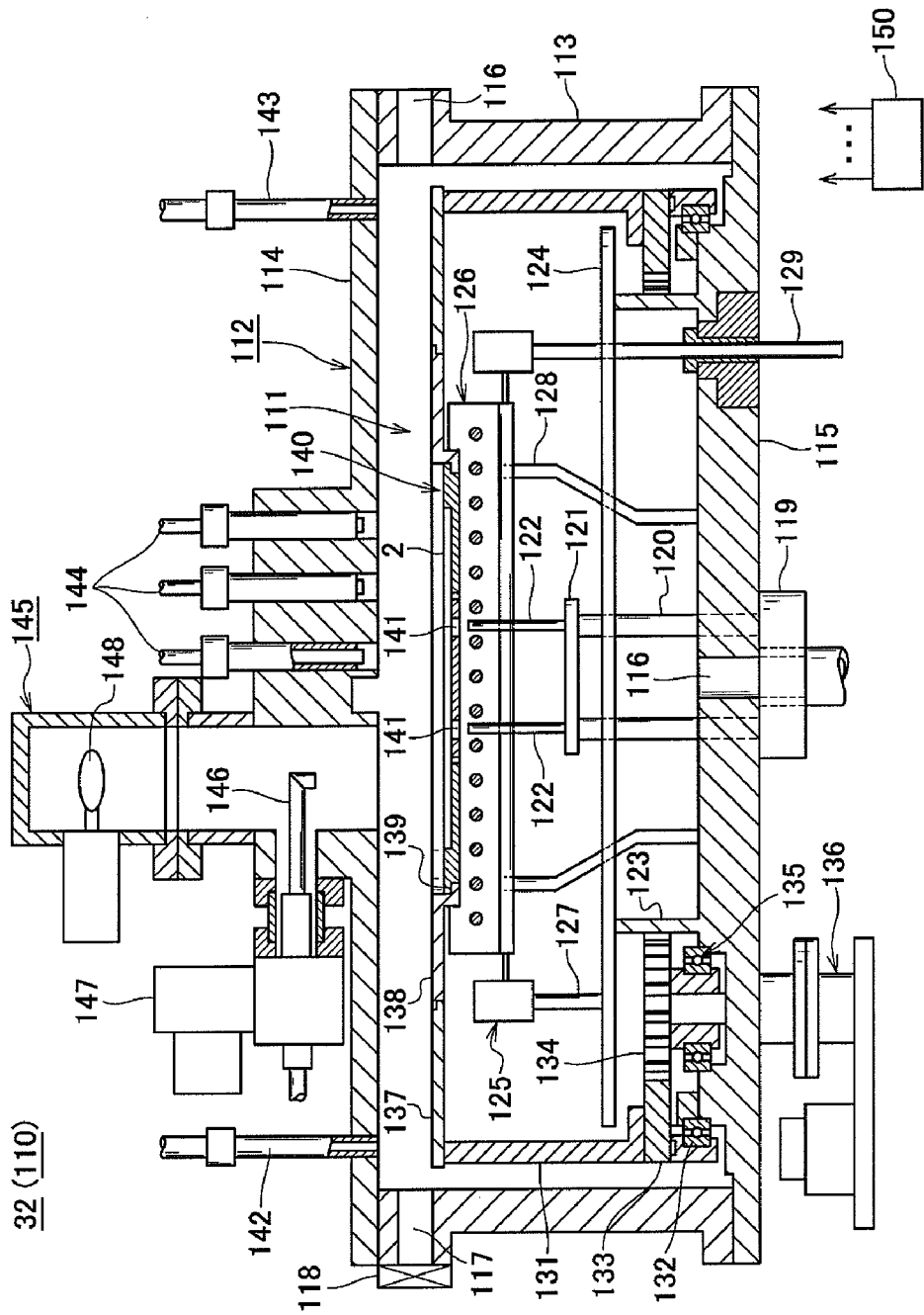
FIG. 5 is a sectional view illustrating a second processing unit (heat treatment unit) of the cluster apparatus according to an embodiment of the present invention.

Next, an explanation will be given on the second processing unit 32 of the cluster apparatus 10 according to the current embodiment. In the current embodiment, the second processing unit 32 is a heat treatment unit, and as shown in FIG. 5, the second processing unit 32 is configured as a single wafer type cold wall substrate processing apparatus. Functionally, the second processing unit 32 is configured as a rapid thermal processing apparatus (hereinafter referred to as an RTP apparatus) 110. Hereinafter, the structure of the RTP apparatus 110 will be described with reference to FIG. 5. FIG. 5 is a sectional view illustrating the RTP apparatus 110 when a wafer is processed.

As shown in FIG. 5, the RTP apparatus 110 includes a case 112 as a processing vessel in which a processing chamber 111 is formed to process a wafer 2. The case 112 has a hollow cylindrical shape formed by: a tube 113 having a cylindrical shape with opened top and bottom sides; a top plate 114 having a circular disk shape and configured to close the opened top side of the tube 113; and a bottom plate 115 having a circular disk shape and configured to close the opened bottom side of the tube 113. In a part of the sidewall of the tube 113, an exhaust outlet 116 is formed to connect the inside and outside of the processing chamber 111. An exhaust device is connected to the exhaust outlet 116 to exhaust the inside of the processing chamber 111 to a pressure lower than atmospheric pressure (hereinafter referred to as a negative pressure). At a position of the sidewall of the tube 113 opposite to the exhaust outlet 116, a wafer carrying entrance 117 is formed to carry the wafer 2 into and out of the processing chamber 111, and the wafer carrying entrance 117 is configured to be opened and closed by the gate valve 118.

Along the centerline of the bottom surface of the bottom plate 115, an elevating drive device 119 is installed. The elevating drive device 119 is configured to lift and elevating shafts 120 which are inserted through the bottom plate 115 in a vertically slidable manner. An elevating plate 121 is horizontally fixed to the upper ends of the elevating shafts 120, and a plurality of lift pins 122 (usually, three or four lift pins) are vertically erected and fixed to the top surface of the elevating plate 121. The lift pins 122 are lifted and lowered according to the lifting and lowering motions of the elevating plate 121 so as to horizontally support the bottom side of the wafer 2 and lift and lower the wafer 2.

On the top surface of the bottom plate 115, a support cylinder 123 is protruded at the outside of the elevating shafts 120. On the top surface of the support cylinder 123, a cooling plate 124 is horizontally installed. Above the cooling plate 124, a first heating lamp group 125 and a second heating lamp group 126 that are constituted by a plurality of heating lamps are sequentially disposed from the lower side, and each of the first and second heating lamp groups 125 and 126 is horizontally installed. The first heating lamp group 125 and the second heating lamp group 126 are horizontally supported by first pillars 127 and second pillars 128, respectively. A power supply line 129 for the first heating lamp group 125 and the second heating lamp group 126 is inserted through the bottom plate 115 and extended to the outside.

In the processing chamber 111, a turret 131 is disposed concentrically with the processing chamber 111. The turret 131 is concentrically fixed to the top surface of an internal spur gear 133. The internal spur gear 133 is horizontally supported on a bearing 132 installed at the bottom plate 115. The internal spur gear 133 is engaged with a drive spur gear 134. The drive spur gear 134 is horizontally supported on a bearing 135 installed at the bottom plate 115 and is configured to be rotated by a susceptor rotating device 136 installed under the bottom plate 115. On the top surface of the turret 131, an outer platform 137 having a flat circular ring shape is horizontally installed. Inside the outer platform 137, an inner platform 138 is horizontally installed. A susceptor 140 is engaged to and held by an engagement part 139 protruding radially from the lower part of the inner circumference of the inner platform 138. Penetration holes 141 are formed in the susceptor 140 at positions corresponding to the lift pins 122.

An annealing gas supply pipe 142 and an inert gas supply pipe 143 are connected to the top plate 114 in a manner such that the annealing gas supply pipe 142 and the inert gas supply pipe 143 can communicate with the inside of the processing chamber 111. A plurality of probes 144 of a radiation thermometer are inserted in the top plate 114 in a manner such that the probes 144 are staggered in radial directions from the center to the periphery of the wafer 2 and face the top surface of the wafer 2. The radiation thermometer is configured such that temperatures detected by the probes 144 from light radiated from the wafer 2 are sequentially transmitted to a controller 150. The controller 150 compares the temperatures measured by the probes 144 with a set temperature and controls the supply amount of power to the first heating lamp group 125 and the second heating lamp group 126.

At another position of the top plate 114, an emissivity measuring device 145 is installed to measure the emissivity of the wafer 2 in a noncontact manner. The emissivity measuring device 145 includes a reference probe 146. The reference probe 146 is configured to be rotated on a vertical plane by a reference probe motor 147. Above the reference probe 146, a reference lamp 148 configured to radiate reference light is installed to face the tip of the reference probe 146. The reference probe 146 measures the temperature of the wafer 2 by comparing radiation from the reference lamp 148 and radiation from the wafer 2. Wafer temperatures measured by the probes 144 are corrected by comparing them with a temperature measured by the reference probe 146, so that wafer temperatures can be precisely detected.

The controller 150 is configured to control each part of the RTP apparatus 110. In addition, the controller 150 is controlled by the main controller 37.

(2) Substrate Processing Process

Next, an explanation will be given on a method of processing a wafer 2 using the above-described cluster apparatus 10 as one of semiconductor device manufacturing processes (substrate processing process). In the following description, an explanation will be given on an exemplary case of processing a wafer 2 on which a titanium nitride (TiN) film is formed as a bottom electrode of a capacitor. Furthermore, in the following description, each part of the cluster apparatus 10 is controlled by the main controller 37.

A cap of a pod 1 placed on the stage 25 of the cluster apparatus 10 is detached by the cap attachment/detachment mechanism 26, and thus a wafer taking in/out entrance of the pod 1 is opened. After the pod 1 is opened, the positive pressure transfer machine 19 installed at the positive pressure transfer chamber 16 picks up wafers 2 one by one from the pod 1 through the wafer carrying entrance and carries the wafers 2 to the carrying-in chamber 14 where the wafers 2 are placed on a carrying-in chamber temporary stage. During this operation, the gate valve 17A disposed at a side of the carrying-in chamber 14 facing the positive pressure transfer chamber 16 is in an opened state; the gate valve 17B disposed at the other side of the carrying-in chamber 14 facing the negative pressure transfer chamber 11 is in a closed state; and the inside of the negative pressure transfer chamber 11 is kept at, for example, 100 Pa.

The side of the carrying-in chamber 14 facing the positive pressure transfer chamber 16 is closed by the gate valve 17A, and the carrying-in chamber 14 is exhaust to a negative pressure by an exhaust device. When the inside pressure of the carrying-in chamber 14 is reduced to a preset pressure, the gate valve 17B disposed at the other side of the carrying-in chamber 14 facing the negative pressure transfer chamber 11 is opened. Next, the negative pressure transfer machine 13 of the negative pressure transfer chamber 11 picks up the wafers 2 one by one from the carrying-in chamber temporary stage and carries the wafers 2 into the negative pressure transfer chamber 11. Thereafter, the gate valve 17B disposed at the other side of the carrying-in chamber 14 facing the negative pressure transfer chamber 11 is closed. Subsequently, the gate valve 44 of the first processing unit 31 is opened, and the negative pressure transfer machine 13 loads the wafer 2 into processing chamber 201 of the first processing unit 31 (wafer loading). When the wafer 2 is loaded into the processing chamber 201, since the carrying-in chamber 14 and the negative pressure transfer chamber 11 are previously vacuum-evacuated, permeation of oxygen or moisture into the processing chamber 201 can be surely prevented.

Figure 2:
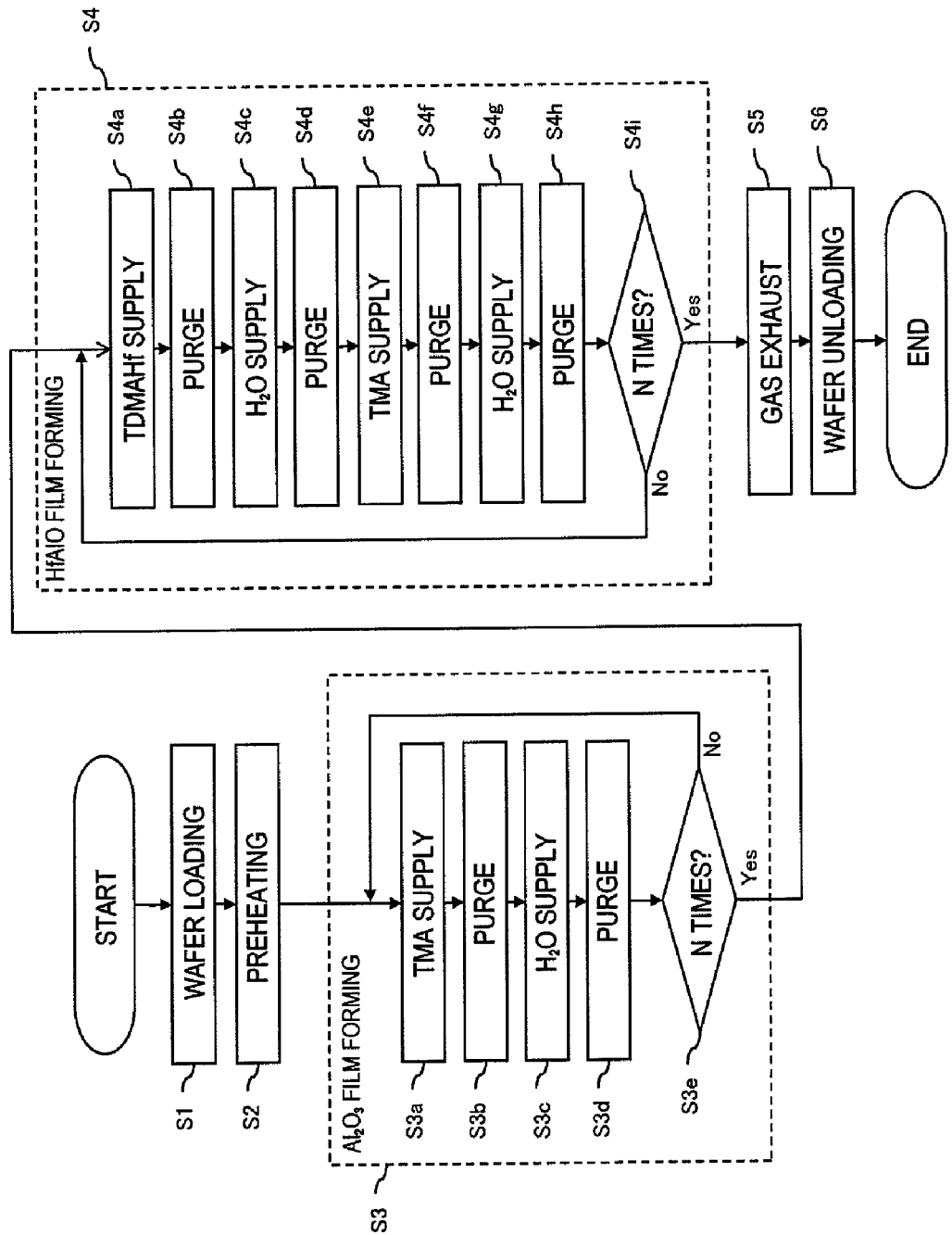
FIG. 2 is a flowchart illustrating a film forming process according to an embodiment of the present invention.

<Film forming process>Next, with reference to FIG. 2, an explanation will be given on a film forming process for forming a high permittivity insulation film as a capacitor insulation film on the bottom electrode of the wafer 2 by using the first processing unit 31 (film forming apparatus 40). FIG. 2 is a flowchart illustrating a film forming process according to an embodiment of the present invention. In the following description, TMA (tri-methyl aluminum: $Al(CH_3)_3$) is used as an Al precursor (Al source), and $H_2O$ is used as an oxidizing precursor, so as to form an $Al_2O_3$ film as an aluminum-containing insulation film on the bottom electrode (TiN film) by an ALD method. Thereafter, TDMAHf (Tetrakis-Dimethyl-Amino-Hafnium: $Hf[N(CH_3)_2]_4$) is used as a Hf precursor (Hf source), TMA is used as an Al precursor, and $H_2O$ is used as an oxidizing precursor, so as to form a hafnium aluminate (HfAlO) film as a high permittivity insulation film on the $Al_2O_3$ film by an ALD method. Furthermore, in the following description, each part of the film forming apparatus 40 is controlled by the controller 280. In addition, the operation of the controller 280 is controlled by the main controller 37.

[Wafer Loading Process S1]

First, the elevating mechanism 207b is operated to lower the support stage 203 to the wafer carrying position as shown in FIG. 4. Then, as described above, the gate valve 44 is opened so that the processing chamber 201 can communicate with the negative pressure transfer chamber 11. Next, as described above, the wafer 2 is loaded from the negative pressure transfer chamber 11 into the processing chamber 201 by using the negative pressure transfer machine 13 in a state where the wafer 2 is supported on the carrying arm 13a (S1). The wafer 2 loaded in the processing chamber 201 is temporarily placed on the lift pins 208b protruding upward from the top surface of the support stage 203. If the carrying arm 13a of the negative pressure transfer machine 13 is returned from the processing chamber 201 to the negative pressure transfer chamber 11, the gate valve 44 is closed.

Next, the elevating mechanism 207b is operated to raise the support stage 203 to the wafer processing position as shown in FIG. 3. As a result, the lift pins 208b are retracted from the top surface of the support stage 203, and the wafer 2 is placed on the susceptor 217 disposed at the top surface of the support stage 203.

[Preheating Process S2]

Next, the pressure regulator 262 adjusts the inside pressure of the processing chamber 201 to a predetermined processing pressure. In addition, power supplied to the heater 206 is adjusted to heat the wafer 2 and increase the surface temperature of the wafer 2 to a predetermined processing temperature.

In the wafer loading process S1, the preheating process S2, and a unloading process S6 (described later), while the vacuum pump 264 is operated, the valves vh3, va3, and vo3 are closed and the valves vh4, va4, and vo4 are opened to allow $N_2$ gas to flow into the processing chamber 201 so as to previously keep the inside of the processing chamber 201 at a $N_2$ gas atmosphere. By this, attachment of particles to the wafer 2 can be suppressed. The vacuum pump 264 is continuously operated at least from the wafer loading process S1 to the wafer unloading process S6 (described later).

Along with the processes S1 and S2, generation of a precursor gas (Al precursor gas), that is, generation of TMA gas is started in advance (pre-vaporization) by vaporizing TMA which is a liquid precursor (Al precursor). That is, in a state where the valve va3 is closed, while supplying a carrier gas to the vaporizer 229a by opening the valve va2, the valve va1 is opened, and at the same time, a pressurizing gas is supplied through the pressurizing gas supply pipe 237a so as to pressurize (supply) the liquid precursor from the liquid precursor supply source 220a to the vaporizer 229a and generate a precursor gas by vaporizing the liquid precursor at the vaporizer 229a. In this pre-vaporization process, while operating the vacuum pump 264, the valve va5 is opened in a state where the valve va3 is closed so that the precursor gas is not supplied into the processing chamber 201 but is exhausted through a route bypassing the processing chamber 201.

In addition, generation of $H_2O$ gas which is an oxidizing precursor (oxidizing gas) is also started in advance. That is, while operating the vacuum pump 264, the valve vo5 is opened in a state where the valve vo3 is closed, so that $H_2O$ gas is not supplied into the processing chamber 201 but is exhausted through a route bypassing the processing chamber 201.

In addition, at this time, generation of a precursor gas (Hf precursor gas), that is, generation of a TDMAHf gas is started in advance (pre-vaporization) by vaporizing TDMAHf which is a liquid precursor (Hf precursor). That is, preferably, while supplying a carrier gas to the vaporizer 229h by opening the valve vh2 in a state where the valve vh3 is closed, the valve vh1 is opened, and at the same time, a pressurizing gas is supplied through the pressurizing gas supply pipe 237h so as to pressurize (supply) the liquid precursor from the liquid precursor supply source 220h to the vaporizer 229h and generate a precursor gas by vaporizing the liquid precursor at the vaporizer 229h. In this pre-vaporization process, while operating the vacuum pump 264, the valve vh5 is opened in a state where the valve vh3 is closed so that the precursor gas is not supplied into to the processing chamber 201 but is exhausted through a route bypassing the processing chamber 201.

It takes time to stably generate precursor gases (TMA gas and TDMAHf gas) from the vaporizers 229a and 229h, and $H_2O$ gas from the $H_2O$ gas supply source 230o. That is, when precursor gases and $H_2O$ gas are initially generated, they are unstably supplied. Therefore, in the current embodiment, generation of precursor gases and $H_2O$ gas are started in advance for previously obtaining a stable supply state, and in this stable supply state, the valves vh3, vh5, va3, va5, vo3, and vo5 are switched to change flow passages of the precursor gases and $H_2O$ gas. Therefore, by switching the valves, stable supply of the precursor gases and $H_2O$ gas into the processing chamber 201 can be quickly started and stopped.

[$Al_2O_3$ Film Forming Process S3]

[TMA Supply Process S3a]

Next, the valves va4 and va5 are closed, and valve va3 is opened so as to supply TMA gas into the processing chamber 201 as a precursor gas. That is, ejection of TMA gas to the wafer 2 is started. The TMA gas is distributed by the shower head 240 so that the TMA gas can be uniformly supplied to the wafer 2 disposed in the processing chamber 201. Surplus TMA gas is allowed to flow in the exhaust duct 259 and is then exhausted to the exhaust outlet 260. When the TMA gas is supplied into the processing chamber 201, so as to prevent permeation of the TMA gas into the first precursor gas supply pipe 213h and the $H_2O$ gas supply pipe 213o and facilitate diffusion of the TMA gas in the processing chamber 201, it is preferable that the valves vh4 and vo4 be kept in an opened state to continuously supply $N_2$ gas into the processing chamber 201. After a predetermined time from the start of supply of the TMA gas by opening the valve va3, the valve va3 is closed, and the valves va4 and va5 are opened to stop supply of the TMA gas into the processing chamber 201.

[Purge Process S3b]

After the valve va3 is closed to stop supply of the TMA gas into the processing chamber 201, supply of $N_2$ gas into the processing chamber 201 is continued in a state where the valves vh4, va4, and vo4 are in an opened state. The $N_2$ gas is supplied into the processing chamber 201 through the shower head 240 and flows in the exhaust duct 259 where the $N_2$ gas is exhausted to the exhaust outlet 260. In this way, the inside of the processing chamber 201 is purged with $N_2$ gas, and TMA gas remaining in the processing chamber 201 is removed.

[$H_2O$ Supply Process S3c]

After the inside of the processing chamber 201 is completely purged, the valves vo4 and vo5 are closed, and the valve vo3 is opened so as to supply $H_2O$ gas into the processing chamber 201 as an oxidizing precursor. That is, ejection of $H_2O$ gas to the wafer 2 is started. The $H_2O$ gas is distributed by the shower head 240 so that the $H_2O$ gas can be uniformly supplied to the wafer 2 disposed in the processing chamber 201. Surplus $H_2O$ gas is allowed to flow in the exhaust duct 259 and is then exhausted to the exhaust outlet 260. When the $H_2O$ gas is supplied into the processing chamber 201, so as to prevent permeation of the $H_2O$ gas into the first precursor gas supply pipe 213h and the second precursor gas supply pipe 213a and facilitate diffusion of the $H_2O$ gas in the processing chamber 201, it is preferable that the valves vh4 and va4 be kept in an opened state to continuously supply $N_2$ gas into the processing chamber 201. After a predetermined time from the start of supply of the $H_2O$ gas by opening the valve vo3, the valve vo3 is closed, and the valves vo4 and vo5 are opened to stop supply of the $H_2O$ gas into the processing chamber 201.

[Purge Process S3d]

After the valve vo3 is closed to stop supply of the $H_2O$ gas into the processing chamber 201, supply of $N_2$ gas into the processing chamber 201 is continued in a state where the valves vh4, va4, and vo4 are in an opened state. The $N_2$ gas is supplied into the processing chamber 201 through the shower head 240 and flows in the exhaust duct 259 where the $N_2$ gas is exhausted to the exhaust outlet 260. In this way, the inside of the processing chamber 201 is purged with $N_2$ gas, and $H_2O$ gas or reaction byproducts remaining in the processing chamber 201 are removed.

[Repetition process S3e]

Thereafter, the processes S3a to S3d are set as one cycle, and this cycle is repeated predetermined times, so that an $Al_2O_3$ film (aluminum-containing insulation film) can be formed on the wafer 2 (that is, on the TiN film (bottom electrode) of the wafer 2) to a predetermined thickness as an initial layer.

[HfAlO Film Forming Process S4]

[TDMAHf supply process S4a]

Next, the valves vh4 and vh5 are closed, and valve vh3 is opened so as to supply TDMAHf gas into the processing chamber 201 as a precursor gas. That is, ejection of TDMAHf gas to the wafer 2 is started. The TDMAHf gas is distributed by the shower head 240 so that the TDMAHf gas can be uniformly supplied to the wafer 2 disposed in the processing chamber 201. Surplus TDMAHf gas is allowed to flow in the exhaust duct 259 and is then exhausted to the exhaust outlet 260. When the TDMAHf gas is supplied into the processing chamber 201, so as to prevent permeation of the TDMAHf gas into the second precursor gas supply pipe 213a and the $H_2O$ gas supply pipe 213o and facilitate diffusion of the TDMAHf gas in the processing chamber 201, it is preferable that the valves va4 and vo4 be kept in an opened state to continuously supply $N_2$ gas into the processing chamber 201. After a predetermined time from the start of supply of the TDMAHf gas by opening the valve vh3, the valve vh3 is closed, and the valves vh4 and vh5 are opened to stop supply of the TDMAHf gas into the processing chamber 201.

[Purge Process S4b]

After the valve vh3 is closed to stop supply of the TDMAHf gas into the processing chamber 201, supply of $N_2$ gas is continued in a state where the valves vh4, va4, and vo4 are in an opened state. The $N_2$ gas is supplied into the processing chamber 201 through the shower head 240 and flows in the exhaust duct 259 where the $N_2$ gas is exhausted to the exhaust outlet 260. In this way, the inside of the processing chamber 201 is purged with $N_2$ gas, and TDMAHf gas remaining in the processing chamber 201 is removed.

[$H_2O$ Supply Process S4c]

Next, like in the $H_2O$ supply process S3c of the $Al_2O_3$ film forming process S3, $H_2O$ gas is ejected to the wafer 2.

[Purge Process S4d]

Thereafter, like in the purge process S3d of the $Al_2O_3$ film forming process S3, the inside of the processing chamber 201 is purged.

[TMA Supply Process S4e]

After that, like in the TMA supply process S3a of the $Al_2O_3$ film forming process S3, TMA gas is ejected to the wafer 2.

[Purge Process S4f]

Next, like in the purge process S3b of the $Al_2O_3$ film forming process S3, the inside of the processing chamber 201 is purged.

[$H_2O$ Supply Process S4g]

Next, like in the $H_2O$ supply process S3c of the $Al_2O_3$ film forming process S3, $H_2O$ gas is ejected to the wafer 2.

[Purge Process S4h]

Next, like in the purge process S3d of the $Al_2O_3$ film forming process S3, the inside of the processing chamber 201 is purged.

[Repetition Process S4i]

Thereafter, the processes S4a to S4h are set as one cycle, and this cycle is repeated predetermined times, so that a HfAlO film having a predetermined thickness can be formed as a high permittivity insulation film on the $Al_2O_3$ film of formed on the wafer 2. Alternatively, the processes S4a to S4d may be set as a first cycle, the processes S4e to S4h may be set as a second cycle, and while the first cycle is repeated predetermined times, the second cycle may be repeated one to several times between the repetition of the first cycle.

When the $Al_2O_3$ film forming process S3 is performed according to an ALD method, the processing temperature (wafer temperature) is controlled in a range where TMA gas does not decompose by itself. In this case, in the TMA supply process S3a, TMA is adsorbed onto the wafer 2. In the $H_2O$ supply process S3c, $H_2O$ reacts with TMA adsorbed on the wafer 2, and thus an $Al_2O_3$ film having less than one atomic layer is formed on the wafer 2.

In addition, When the HfAlO film forming process S4 is performed according to an ALD method, the processing temperature (wafer temperature) is controlled in a range where TDMAHf gas does not decompose by itself In this case, in the TDMAHf supply process S4a, TDMAHf is adsorbed onto the wafer 2. In the $H_2O$ supply process S4c, $H_2O$ reacts with TDMAHf adsorbed on the wafer 2, and thus a $HfO_2$ film having less than one atomic layer is formed on the wafer 2. Furthermore, in the TMA supply process S4e, TMA is adsorbed onto the wafer 2. In the $H_2O$ supply process S4g, $H_2O$ reacts with TMA adsorbed on the wafer 2, and thus an $Al_2O_3$ film having less than one atomic layer is formed on the wafer 2.

In the film forming apparatus of the current embodiment, when an $Al_2O_3$ film is formed by an ALD method, the following exemplary processing conditions may be used. Wafer temperature: 100° C. to 400° C., processing chamber pressure: 1 Pa to 1000 Pa, TMA supply flow rate: 10 sccm to 2000 sccm, $H_2O$ supply flow rate: 10 sccm to 2000 sccm, $N_2$ (purge gas) supply flow rate: 10 sccm to 10000 sccm, and film thickness: 0.1 nm to 0.3 nm.

Furthermore, in the film forming apparatus of the current embodiment, when a HfAlO film is formed by an ALD method, the following exemplary processing conditions may be used. Wafer temperature: 100° C. to 400° C., processing chamber pressure: 1 Pa to 1000 Pa, TDMAHf supply flow rate: 10 sccm to 2000 sccm, TMA supply flow rate: 10 sccm to 2000 sccm, $H_2O$ supply flow rate: 10 sccm to 2000 sccm, $N_2$ (purge gas) supply flow rate: 10 sccm to 10000 sccm, and film thickness: 4 nm to 12 nm.

[Gas Exhaust Process S5]

After the insulation film (a film formed by stacking the $Al_2O_3$ film and the HfAlO film) is formed to a predetermined thickness, the inside of the processing chamber 201 is vacuum-evacuated. Alternatively, while supplying inert gas into the processing chamber 201, the inside of the processing chamber 201 may be vacuum-evacuated and purged. Thereafter, the inside atmosphere of the processing chamber 201 is replaced with inert gas.

[Wafer Unloading Process S6]

After that, in the reverse order to that of the wafer loading process S1, the wafer 2 on which the $Al_2O_3$ film and the HfAlO film are formed to predetermined thicknesses is unloaded from the processing chamber 201 to the negative pressure transfer chamber 11.

<Heat Treatment Process>

Next, an explanation will be given on a heat treatment process (post deposition annealing, PDA) for heat-treating the $Al_2O_3$ film and the HfAlO film formed on the wafer 2 to predetermined thicknesses by using the second processing unit 32 (RTP apparatus 110). That is, an explanation will be given on a process of annealing the $Al_2O_3$ film and HfAlO film having predetermined thicknesses under an inert gas atmosphere to make the $Al_2O_3$ film and the HfAlO film dense or crystallize the $Al_2O_3$ film and HfAlO film. In the following description, each part of the RTP apparatus 110 is controlled by the controller 150, and the controller 150 is controlled by the main controller 37.

After the gate valve 44 is closed in the wafer unloading process S6, the gate valve 118 is opened. After the gate valve 118 is opened, the wafer 2 to be processed by annealing is loaded into the processing chamber 111 of the RTP apparatus 110 (second processing unit 32) through the wafer carrying entrance 117 and is placed on the upper ends of the lift pins 122 by the negative pressure transfer machine 13. If the negative pressure transfer machine 13 is moved backward from the processing chamber 111 after the negative pressure transfer machine 13 places the wafer 2 on the lift pins 122, the wafer carrying entrance 117 is closed by the gate valve 118. In addition, the elevating shafts 120 are lowered by the elevating drive device 119 such that the wafer 2 is transferred from the lift pins 122 to the top of the susceptor 140. In a state where the processing chamber 111 is hermetically closed, the inside of the processing chamber 111 is exhausted through the exhaust outlet 116 to a predetermined pressure in the range from 1 Pa to 1000 Pa.

After the wafer 2 is transferred to the susceptor 140, the turret 131 holding the wafer 2 with the susceptor 140 is rotated by the susceptor rotating device 136. While the wafer 2 held on the susceptor 140 is rotated by the susceptor rotating device 136, the wafer 2 is heated by the first heating lamp group 125 and the second heating lamp group 126 to a predetermined temperature in the range from 400° C. to 700° C., preferably to a temperature higher than the temperature of the wafer 2 in the $Al_2O_3$ film forming process S3 and the HfAlO film forming process. During the rotation and heating, inert gas such as nitrogen gas or argon gas is supplied into the processing chamber 111 through the annealing gas supply pipe 142. At this time, the supply flow rate of the inert gas is adjusted to a predetermined value in the range from 10 sccm to 10000 sccm. Since the wafer 2 is uniformly heated by the first heating lamp group 125 and the second heating lamp group 126 while the susceptor 140 is rotated by the susceptor rotating device 136, the entire surface of the insulation film (a film formed by stacking the $Al_2O_3$ film and the HfAlO film) having a predetermined thickness and formed on the wafer 2 can be uniformly annealed. At this time, the HfAlO film can be doped with Al atoms transferred from the $Al_2O_3$ film. The annealing treatment may be formed for a predetermined time in the range from 1 second to 60 seconds. By this heat treatment, the insulation film having a predetermined thickness and formed on the wafer 2 can be densified or crystallized.

After a preset process time of the RTP apparatus 110, the inside of the processing chamber 111 is exhausted to a predetermined negative pressure through the exhaust outlet 116, and then the gate valve 118 is opened. Thereafter, the annealed wafer 2 is unloaded from the processing chamber 111 to the negative pressure transfer chamber 11 by the negative pressure transfer machine 13 in the reverse order to the loading order.

After the wafer 2 is processed through the high permittivity insulation film forming process and the heat treatment process, if necessary, the wafer 2 may be cooled by the first cooling unit 35 or the second cooling unit 36.

Thereafter, the side of the carrying-out chamber 15 facing the negative pressure transfer chamber 11 is opened by the gate valve 18B, and the negative pressure transfer machine 13 carries the wafer 2 from the negative pressure transfer chamber 11 to the carrying-out chamber 15 where the wafer 2 is transferred to a carrying-out chamber temporary stage. For this, the side of the carrying-out chamber 15 facing the positive pressure transfer chamber 16 is previously closed by the gate valve 18A, and the carrying-out chamber 15 is exhausted to a negative pressure by an exhaust device. After the pressure of the carrying-out chamber 15 is decreased to a preset value, the side of the carrying-out chamber 15 facing the negative pressure transfer chamber 11 is opened by the gate valve 18B, and the wafer 2 is unloaded from the negative pressure transfer chamber 11. After the wafer 2 is unloaded, the gate valve 18B is closed.

By repeating the above-described actions, twenty five wafers 2 batch-loaded in the carrying-in chamber 14 can be sequentially processed through the above-described processes. After the twenty five wafers 2 are sequentially processed, the processed wafers 2 are collected on the temporary stage of the carrying-out chamber 15.

Thereafter, nitrogen gas is supplied into the carrying-out chamber 15 which is kept at a negative pressure so as to adjust the inside pressure of the carrying-out chamber 15 to atmospheric pressure, and then the side of the carrying-out chamber 15 facing the positive pressure transfer chamber 16 is opened by the gate valve 18A. Next, a cap of an empty pod 1 placed on the stage 25 is opened by the cap attachment/detachment mechanism 26 of the pod opener 24. Subsequently, the positive pressure transfer machine 19 of the positive pressure transfer chamber 16 picks up the wafers 2 from the carrying-out chamber 15 to the positive pressure transfer chamber 16 and carries the wafers 2 into the pod 1 through the wafer carrying entrance 23 of the positive pressure transfer chamber 16. After the processed twenty five wafers 2 are carried into the pod 1, the cap of the pod 1 is attached to the wafer taking in/out entrance of the pod 1 by the cap attachment/detachment mechanism 26 of the pod opener 24 so that the pod 1 is closed.

In the current embodiment, wafers 2 processed through sequential processes in the cluster apparatus 10 are hermetically accommodated in a pod 1, and are then carried to another film forming apparatus that performs an top electrode forming process.

(3) Effects of Current Embodiment

According to the current embodiment, one or more of the following effects can be obtained.

According to the current embodiment, in the $Al_2O_3$ film forming process S3, an $Al_2O_3$ film is formed as an initial layer on a TiN film which is a bottom electrode. Thereafter, in the HfAlO film forming process S4, a HfAlO film is formed on the $Al_2O_3$ film. The oxygen diffusion rate and oxygen permeability of the $Al_2O_3$ film are lower than those of the HfAlO film. Thus, OH remaining in the HfAlO film without participating in a reaction is difficult to permeate the $Al_2O_3$ film, and thus oxidation of the TiN film can be prevented. As a result, deterioration of the electrical characteristics of the TiN film can be prevented. For example, a decrease in the capacitance of a capacitor can be prevented.

As a film having low oxygen permeability, a $Si_3N_4$ film may be formed instead of the $Al_2O_3$ film. However, it is difficult to control the thickness and quality of a $Si_3N_4$ thin film under a low temperature condition. In addition, to form a $Si_3N_4$ thin film having a sufficient quality, a higher temperature condition is necessary as compared with the temperature condition of the HfAlO film forming process S4. Therefore, if a $Si_3N_4$ film and a HfAlO film are sequentially formed in the same processing chamber 201, it may take considerable time to adjust the inside temperature of the processing chamber 201, and thus the productivity of a film forming process may be lowered. Furthermore, in the case of a $Si_3N_4$ film is formed under a high temperature condition, the lower TiN film may be excessively doped with nitrogen.

However, according to the current embodiment, the temperature conditions of the $Al_2O_3$ film forming process S3 and the HfAlO film forming process S4 are set in the same range. Therefore, the $Al_2O_3$ film forming process S3 and the HfAlO film forming process S4 can be performed in the same processing chamber 201 without having to adjust the temperature condition largely. For example, the $Al_2O_3$ film forming process S3 and the HfAlO film forming process S4 can be continuously performed under the same temperature condition. Owing to this, a time necessary for performing the film forming process can be reduced, and thus the productivity of the film forming process can be improved. Furthermore, the lower TiN film can be prevented from being excessively doped with nitrogen.

In addition, according to the current embodiment, since a heat treatment process (post deposition annealing, PDA) is performed after the HfAlO film is formed, the HfAlO film can be doped with Al transferred from the $Al_2O_3$ film. Owing to this, the Al concentration of the HfAlO film can be finely controlled, and the permittivity of the HfAlO film can be increased. In the case where a film having low oxygen permeability such as a $Si_3N_4$ film or $SiO_2$ film is formed instead of the $Al_2O_3$ film, the HfAlO film may not be doped with Al, and thus the Al concentration of the HfAlO film may not be finely controlled.

In addition, according to the current embodiment, by using the RTP apparatus 110 as the second processing unit 32, a heat treatment process (PDA) is performed to the HfAlO film and the $Al_2O_3$ film formed on the wafer 2 to predetermined thicknesses. Owing to this, the $Al_2O_3$ film and the HfAlO film can be densified or crystallized.

Experimental Example

Hereinafter, an experimental example of the present invention will be explained together with a comparative example.

FIG. 8A is a flowchart illustrating a substrate processing process for preparing an evaluation sample in the experimental example of the present invention, and FIG. 8B is a flowchart illustrating a substrate processing process for preparing an evaluation sample in the comparative example. In the experimental example shown in FIG. 8A, the following processes were sequentially performed as follows: a TiN film was formed as a bottom electrode (Bottom TiN deposition); an $Al_2O_3$ film was formed on the TiN film ($Al_2O_3$ deposition); a HfAlO film was formed on the $Al_2O_3$ film (HfAlO deposition); a heat treatment process was performed at 700° C. (post deposition annealing, PDA); a TiN film was formed on the heat-treated HfAlO film as a top electrode (Top TiN deposition); patterning was performed using a photolithography technique (Patterning); and a forming gas annealing (FGA) was performed. The $Al_2O_3$ deposition corresponds to the $Al_2O_3$ film forming process S3, the HfAlO deposition corresponds to the HfAlO film forming process S4, and the PDA corresponds to the heat treatment process. In addition, in the example shown in FIG. 8B, the processes from the $Al_2O_3$ deposition to the PDA were performed using the substrate processing apparatus of the above-described embodiment. In the example shown in FIG. 8B, processes from HfAlO deposition to PDA were performed using the substrate processing apparatus of the above-described embodiment. In addition, processing conditions of each processing process were set in the processing condition ranges of the above-described embodiment.

Figure 9B:
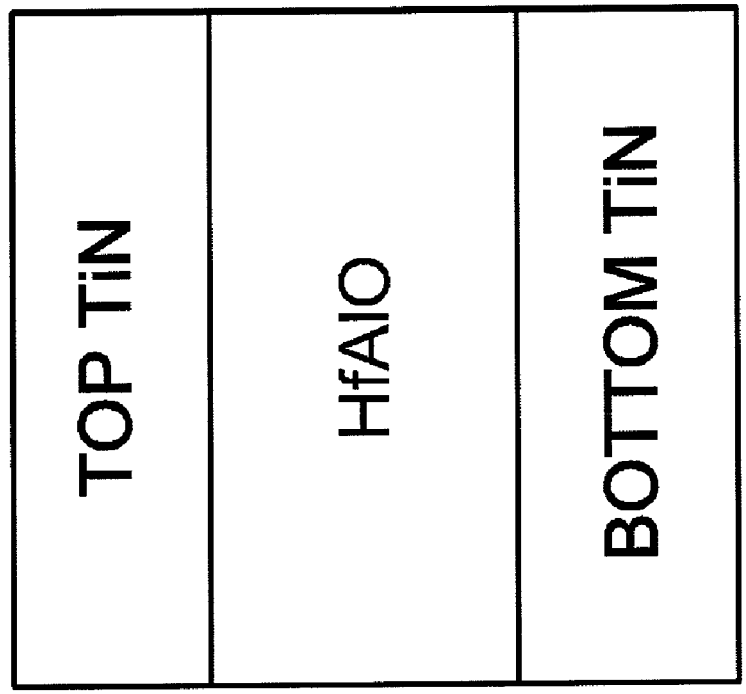
FIG. 9B is a sectional view illustrating a stacked structure of the evaluation sample of the comparative example.
Figure 9A:
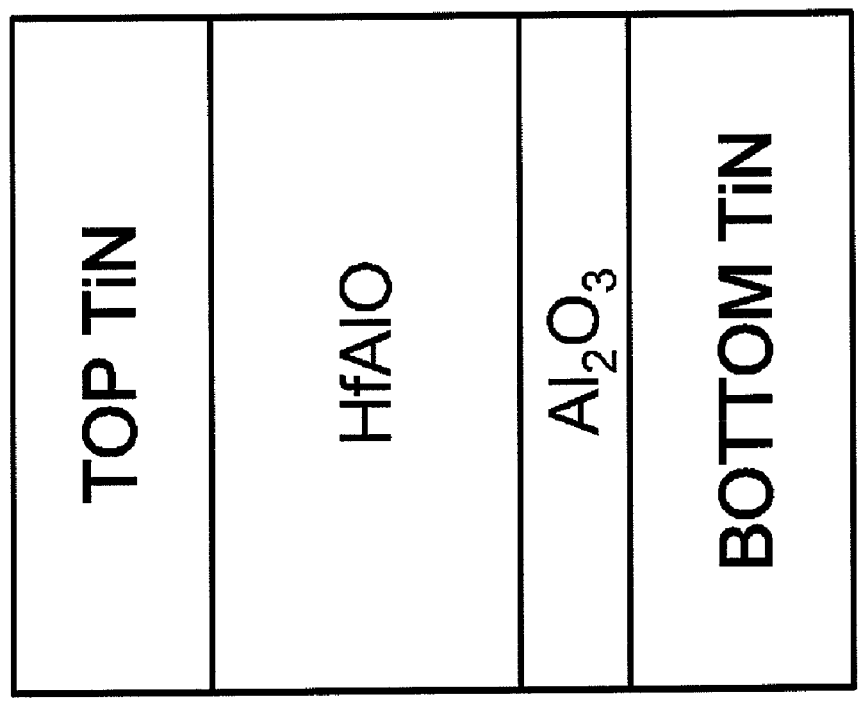
FIG. 9A is a sectional view illustrating a stacked structure of the evaluation sample of the experimental example of the present invention.

FIG. 9A is a sectional view illustrating a stacked structure of the evaluation sample of the experimental example formed according to the flow shown in FIG. 8A, and FIG. 9B is a sectional view illustrating a stacked structure of the evaluation sample of the comparative example formed according to the flow shown in FIG. 8B.

Figure 10A:
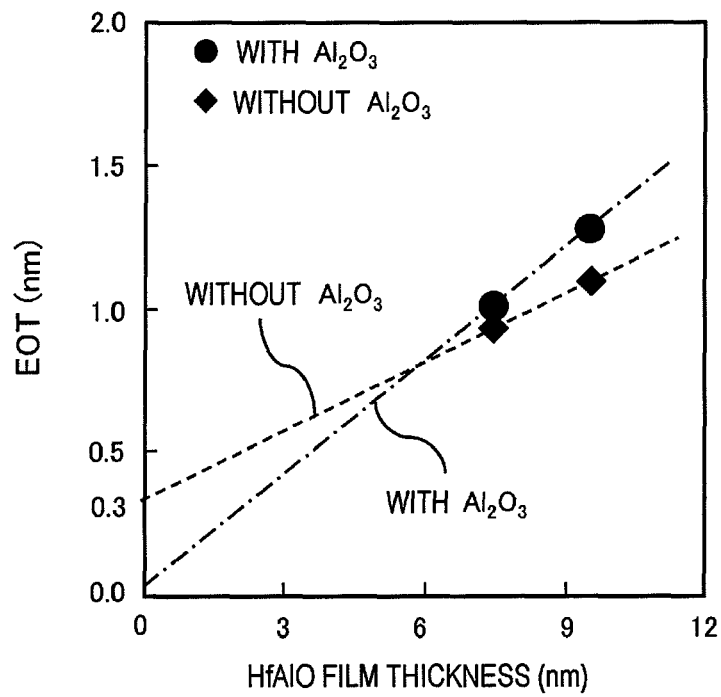
FIG. 10A is a graph illustrating a relationship between hafnium aluminate (HfAlO) film thickness and equivalent oxide thickness (EOT) of an inter-electrode insulation film.

FIG. 10A is a graph illustrating a relationship between HfAlO film thickness and equivalent oxide thickness (EOT) of an inter-electrode insulation film for the case of the evaluation sample of FIG. 9A (experimental example) in which the HfAlO film was formed on the TiN film with the $Al_2O_3$ film being disposed between the HfAlO film and the TiN film and for the case of the evaluation example of FIG. 9B (comparative example) in which the HfAlO film was formed on the TiN film without an $Al_2O_3$ film being disposed between the HfAlO film and the TiN film. In FIG. 10A, the horizontal axis denotes the thickness (nm) of a HfAlO film, and the vertical axis denotes the EOT (nm) of an inter-electrode insulation film. Furthermore, in FIG. 10A, the symbol "●" denotes the case (experimental example) where the HfAlO film was formed in a state where the $Al_2O_3$ film was formed as an intervening film, and the symbol "♦" denotes the case (comparative example) where the HfAlO film was formed in a state where no $Al_2O_3$ film was formed as an intervening film. Referring to the intercepts of the EOT lines plotted with respect to the physical thickness of the HfAlO film in FIG. 10A, in the case (denoted by the symbol "♦") where the HfAlO film was formed without an intervening $Al_2O_3$ film, the EOT was increased by about 0.3nm. It is considered that the increase of the EOT is caused by a TiO(N) film formed by oxidation of the TiN film (bottom electrode). On the other hand, in the case (denoted by symbol "●") where the HfAlO film was formed in a state where the $Al_2O_3$ film was formed as an intervening film, the EOT was not substantially increased, and thus it can be understood that oxidation of the TiN film (bottom electrode) was suppressed. In addition, referring to FIG. 10A, the $Al_2O_3$ line (a dashed-dotted line indicated by the symbol "●") intersects the non-Al2O3 line (a dashed line indicated by the symbol "♦"); however, since the slope of the $Al_2O_3$ line (indicated by the symbol "●") can be changed by varying the Al concentration of the HfAlO film, it can be made that the two lines do not intersect each other. For example, if the Al concentration of the HfAlO film is set to 0% (if a $HfO_2$ film is used instead of the HfAlO film), the slope of the $Al_2O_3$ line (indicated by the symbol "●") may become smaller than the slope of the non-Al2O3 line (indicated by the symbol "♦"), and thus the two lines may not interest each other.

Figure 10B:
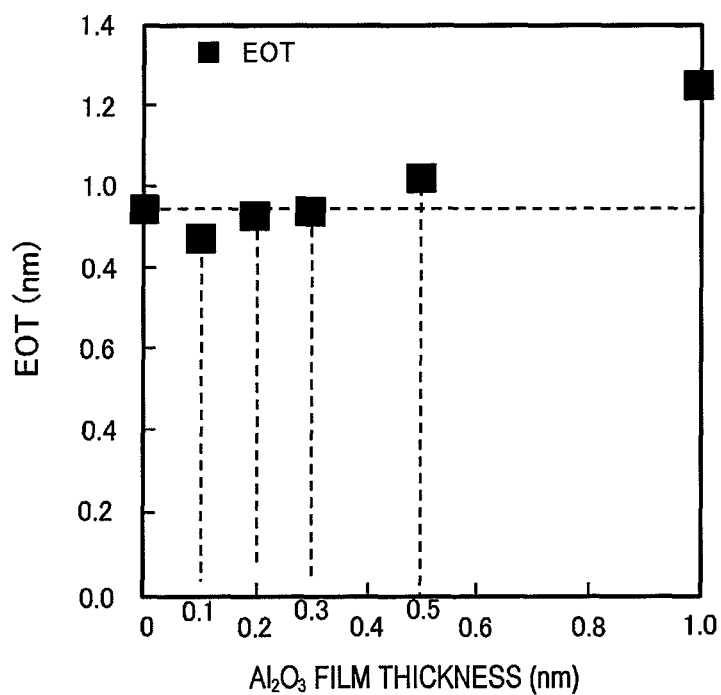
FIG. 10B is a graph illustrating a relationship between aluminum oxide ($Al_2O_3$) film thickness and EOT of an inter-electrode insulation film.

FIG. 10B is a graph illustrating a relationship between the thickness of the $Al_2O_3$ film formed on the TiN film and the EOT of an inter-electrode insulation film for the evaluation samples. In FIG. 10B, the horizontal axis denotes the thickness (nm) of the $Al_2O_3$ film, and the vertical axis denotes the EOT (nm) of the inter-electrode insulation film. Referring to FIG. 10B, in the case (experimental example) where the $Al_2O_3$ film was formed to a thickness of 0.1 nm to 0.3 nm, as compared with the case where the HfAlO film was formed in a state where no $Al_2O_3$ film was formed between the TiN film and the $Al_2O_3$ film (in FIG. 10B, when the thickness of the $Al_2O_3$ film is zero), the EOT was small although the total physical thickness of the insulation film (a stacked film of the $Al_2O_3$ film and the HfAlO film) was increased by the thickness of the $Al_2O_3$ film. If the thickness of the $Al_2O_3$ film is greater than 0.3 nm, the EOT increases as compared with the case where the $Al_2O_3$ film is not formed (for example, refer to the EOT values when the thickness of the $Al_2O_3$ film is 0.5 nm and 1.0 nm in FIG. 10B), and thus the permittivity decreases.

The minimum thickness of a film that can be formed by performing a film forming process once according to an ALD method is about 0.1 nm. Therefore, when an ALD method is used, it may be preferable that the thickness of an $Al_2O_3$ film be set to 0.1 nm to 0.3 nm. In addition, referring to FIG. 10B, it is preferable that the thickness of the $Al_2O_3$ film be set to 0.1 nm to 0.2 nm because the EOT can be reduced much more.

Figure 11A:
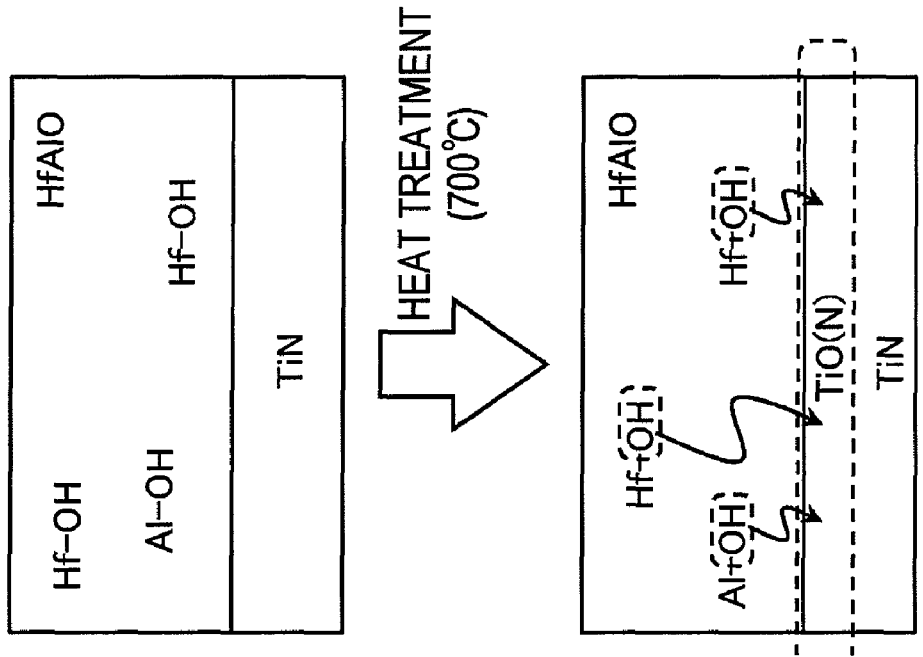
FIG. 11A is a schematic view illustrating a model for suppressing oxidation of a bottom electrode in the experimental example of the present invention.
Figure 11B:
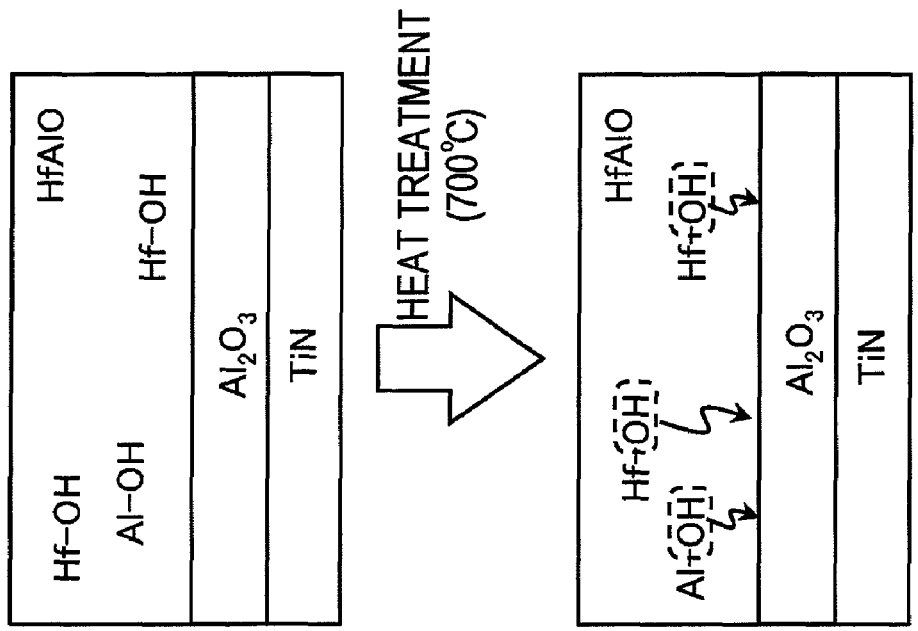
FIG. 11B is a schematic view illustrating an oxidation model of a bottom electrode in the comparative example.

FIG. 11A is a schematic view illustrating a model for suppressing oxidation of the bottom electrode in the experimental example of the present invention, and FIG. 11B is a schematic view illustrating an oxidation model of the bottom electrode in the comparative example. As described above, if a HfAlO film is formed by using $H_2O$ as an oxidizing precursor, OH which has not participated in a reaction may remain in the HfAlO film. The remaining unreacted OH can be removed if the HfAlO film is heated to, for example, 400° C. to 700° C. As shown in FIG. 11B, in the case (comparative example) where the HfAlO film was formed on the TiN film without an $Al_2O_3$ film being disposed between the HfAlO film and the TiN film, unreacted OH removed from the HfAlO film by heat treatment could reach the TiN film (bottom electrode) and oxidize the TiN film to form an TiO(N) layer. On the other hand, as shown in FIG. 11A, in the case (experimental example) where the HfAlO film was formed on the TiN film with the $Al_2O_3$ film being disposed therebetween, the $Al_2O_3$ film suppressed permeation of OH, and thus oxidation of the TiN film could be suppressed (or prevented). This is because the oxygen permeability of the $Al_2O_3$ film is lower than the oxygen permeability of the HfAlO film or $HfO_2$ film. In addition, the oxygen permeability of the HfAlO film is lower than that of the $HfO_2$ film, and this may be because Al added in the $HfO_2$ film suppresses permeation of oxygen.

In the case where the HfAlO film is formed on the TiN film with the $Al_2O_3$ film being disposed therebetween, not only the effect of suppressing oxidation of the TiN film but also another effect can be obtained. That is, in the case where the HfAlO film is formed on the TiN film with the $Al_2O_3$ film being disposed therebetween, the HfAlO film can be doped with Al transferred from the $Al_2O_3$ film (Al doping effect).

Figure 12:
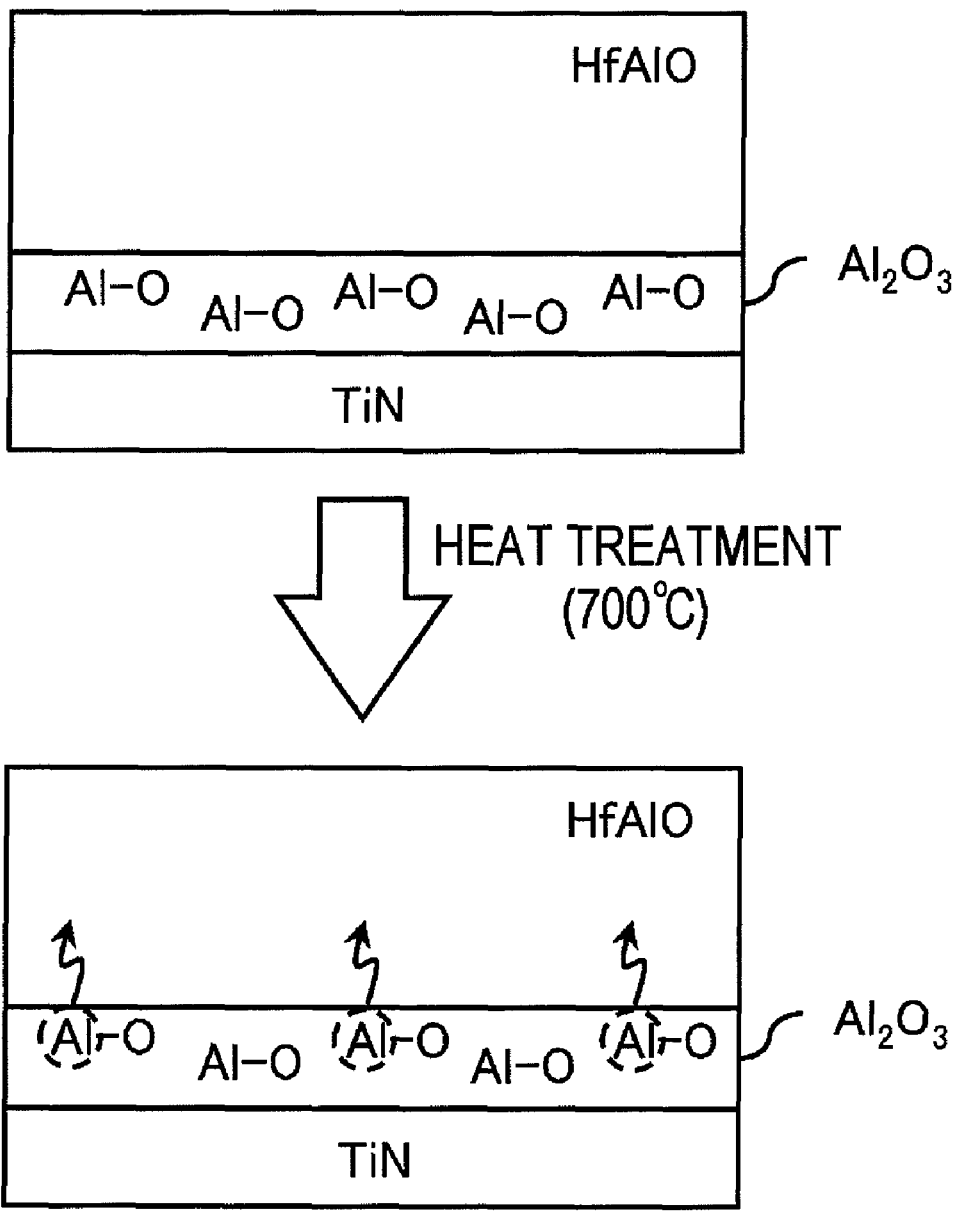
FIG. 12 is a schematic view illustrating a model for doping a HfAlO film with aluminum (Al) transferred from an $Al_2O_3$ film.

FIG. 12 is a schematic view illustrating a model for doping a HfAlO film with Al transferred from an $Al_2O_3$ film. When a heat treatment process (post deposition annealing, PDA) is performed after the HfAlO film is formed, if processing conditions of the heat treatment process are set in the above-described ranges, the HfAlO film can be doped with Al transferred from the $Al_2O_3$ film by thermal diffusion. That is, through the heat treatment process, the Al concentration of the HfAlO film can be finely controlled, and the Al concentration can be increased. The total amount of Al doped in the HfAlO film after PDA is the sum of the amount of Al doped in the HfAlO film during the formation of the HfAlO film and the amount of Al diffused from the $Al_2O_3$ film to the HfAlO film during the PDA. Therefore, by previously investigating the relationship between the Al doping amount and HfAlO film forming conditions in a HfAlO film forming process and the relationship between the Al doping amount from the $Al_2O_3$ film to the HfAlO film and PDA conditions in a PDA process, the Al concentration of the HfAlO film can be adjusted to a desired value after the PDA process. In a HfAlO film forming process, an Al doping amount can be controlled by adjusting processing conditions such as the inside pressure of a processing chamber, the supply flow rate of TMA, the supply time of TMA, and the execution number of the second cycle (process S4e to S4h) during the repetition of the first cycle (processes S4a to S4d). Furthermore, in the heat treatment process (PDA), the Al doping amount from the $Al_2O_3$ film to the HfAlO film can be controlled by adjusting processing conditions such as the temperature of a wafer, the pressure of a processing chamber, and annealing time.

By controlling the Al concentration of the HfAlO film, the permittivity of the HfAlO film can be controlled. For example, by adjusting the Al concentration of the HfAlO film to 4% to 5%, the permittivity of the HfAlO film may be increased to about 35.

A $HfO_2$ film may be used instead of the HfAlO film to obtain the same effects. That is, a $HfO_2$ film is formed after the $Al_2O_3$ film is formed, and then a heat treatment process is performed to dope the $HfO_2$ film with Al transferred from the $Al_2O_3$ film by thermal diffusion. In this way, the $HfO_2$ film is changed into a HfAlO film. By using a previously measured Al doping amount from the $Al_2O_3$ film to the $HfO_2$ film in a heat treatment process, the Al concentration of the HfAlO film after the heat treatment process can be controlled.

Alternatively, an AlN film may be used instead of the $Al_2O_3$ film to obtain the same effects (i.e., a bottom electrode oxidation suppressing effect and an Al doping effect). In other words, as an oxygen diffusion blocking film, an Al-containing insulation film such as an $Al_2O_3$ film and an AlN film may be used.

Another Embodiment of Invention

In the above-described embodiment, an explanation has been given on the exemplary case of forming a film by using a single wafer type ALD apparatus which is a substrate processing apparatus (film-forming apparatus) configured to process substrates one by one. However, the present invention is not limited thereto. For example, films can be formed by using a substrate processing apparatus such as a batch type vertical ALD apparatus configured to process a plurality of substrates at a time. Hereinafter, a vertical ALD apparatus will be described.

Figure 7A:
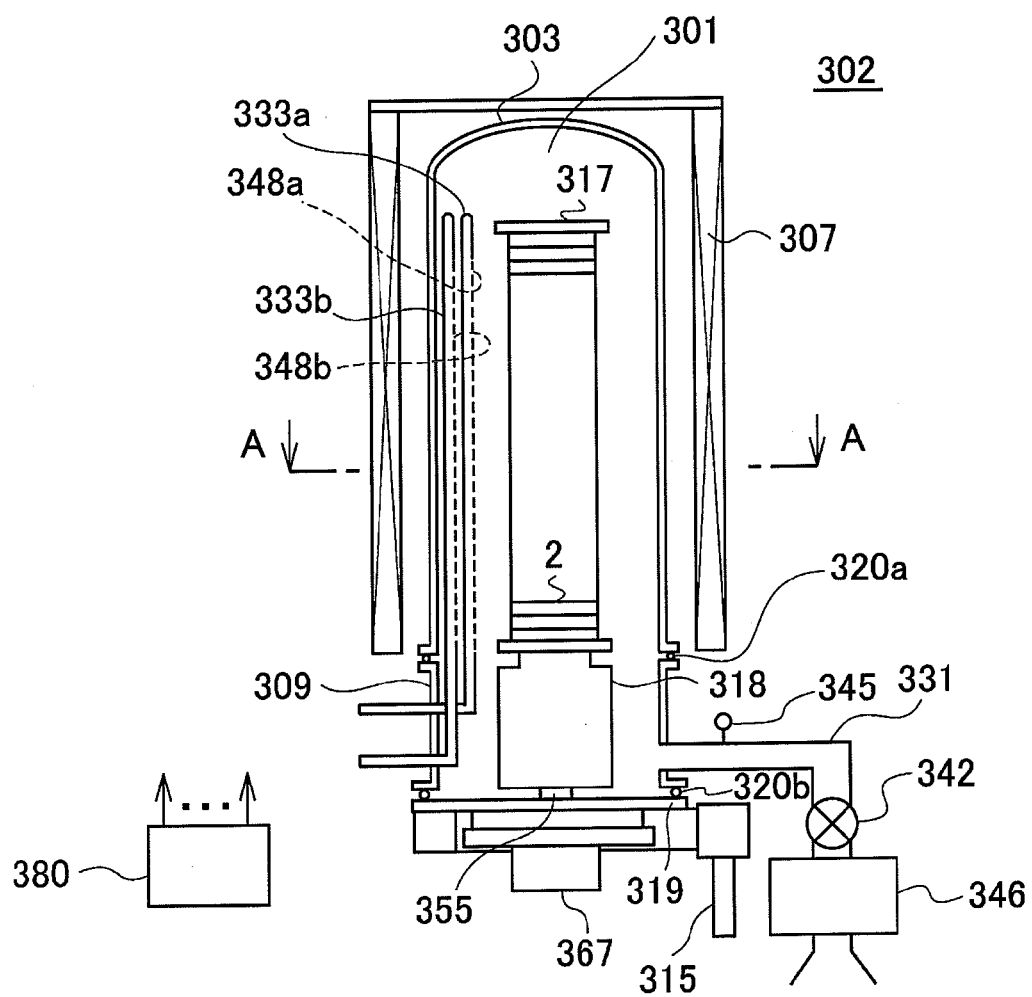
Figure 7B:
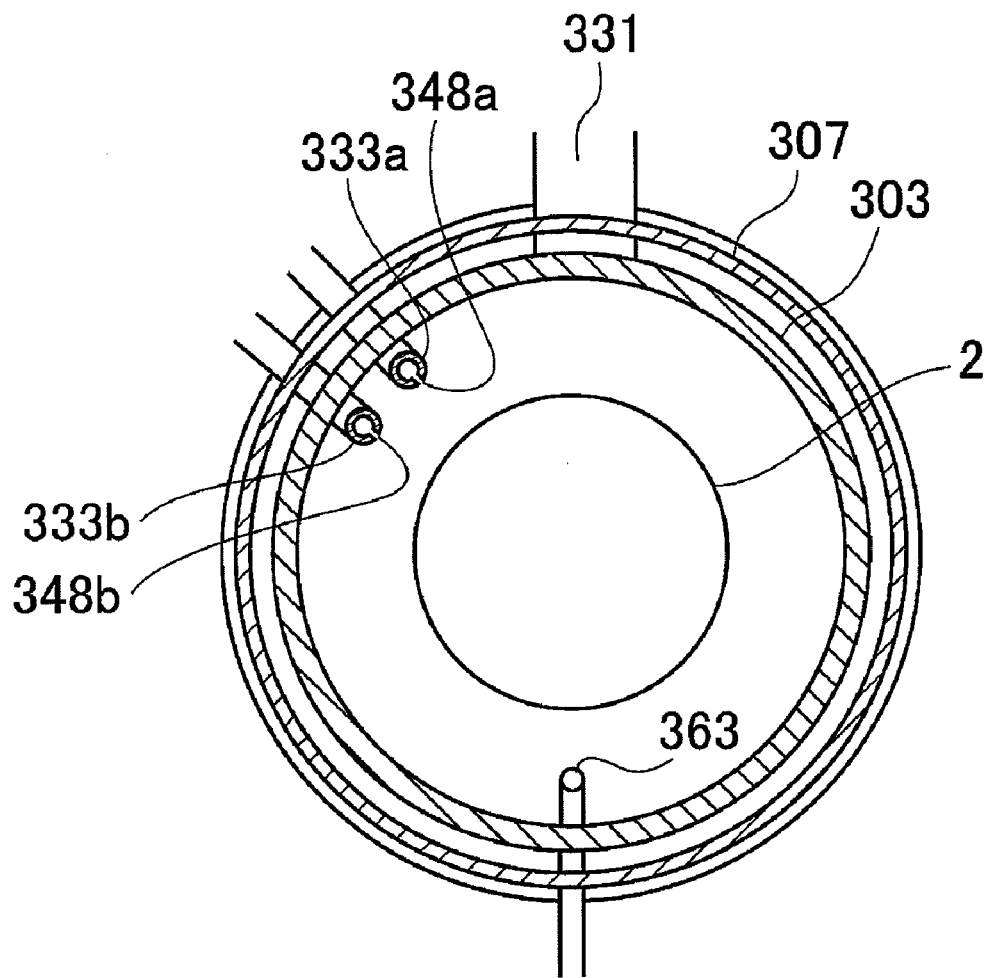

FIG. 7A and FIG. 7B are schematic views illustrating a vertical processing furnace 302 of a vertical ALD apparatus according to an embodiment of the present invention, in which FIG. 7A is a vertical sectional view illustrating the vertical processing furnace 302 and FIG. 7B is a sectional view of the vertical processing furnace 302 taken along line A-A of FIG. 7A.

As shown in FIG. 7A, the processing furnace 302 includes a heater 307 as a heating unit (heating mechanism). The heater 307 has a cylindrical shape and is supported on a holding plate such as a heater base so that the heater 307 can be vertically fixed.

Inside the heater 307, a processing tube 303 is installed concentrically with the heater 307 as a reaction tube. The processing tube 303 is made of a heat-resistant material such as quartz ($SiO_2$) and silicon carbide (SiC) and has a cylindrical shape with a closed top side and an opened bottom side. In the hollow part of the processing tube 303, a processing chamber 301 is formed, which is configured to accommodate substrates such as wafers 2 in a state where the wafers 2 are horizontally positioned and vertically arranged in multiple stages in a boat 317 (described later).

At the lower side of the processing tube 303, a manifold 309 is installed concentrically with the processing tube 303. The manifold 309 is made of a material such as stainless steel and has a cylindrical shape with opened top and bottom sides. The manifold 309 is engaged with the processing tube 303 and installed to support the processing tube 303. Between the manifold 309 and the processing tube 303, an O-ring 320a is installed as a seal member. The manifold 309 is supported by the heater base such that the processing tube 303 can be vertically fixed. The processing tube 303 and the manifold 309 constitute a reaction vessel.

A first nozzle 333a as a first gas introducing part, and a second nozzle 333b as a second gas introducing part are connected to the manifold 309 in a manner such that the first and second nozzles 333a and 333b penetrate the sidewall of the manifold 309. Each of the first and second nozzles 333a and 333b has an L-shape with a horizontal part and a vertical part. The horizontal part is connected to the manifold 309, and the vertical part is erected in an arc-shaped space between the inner wall of the processing tube 303 and the wafers 2 along the inner wall of the processing tube 303 from the bottom side to the top side in the arranged direction of the wafers 2. In the lateral sides of the vertical parts of the first and second nozzles 333a and 333b, first gas supply holes 348a and second gas supply holes 348b are formed, respectively. The first and second gas supply holes 348a and 348b have the same size and are arranged at the same pitch from the lower side to the upper side.

The same gas supply systems as those explained in the previous embodiment are connected to the first and second nozzles 333a and 333b. However, the current embodiment is different from the previous embodiment, in that the first precursor gas supply pipe 213h and the second precursor gas supply pipe 213a are connected to the first nozzle 333a, and the H$_2$O gas supply pipe 213o is connected to the second nozzle 333b. In the current embodiment, precursor gases (TDMAHf gas and TMA gas) are supplied through a nozzle different from a nozzle through which an oxidizing precursor (H2O) is supplied. In addition, the precursor gases may be supplied through different nozzles.

At the manifold 309, an exhaust pipe 331 is installed to exhaust the inside atmosphere of the processing chamber 301. A vacuum exhaust device such as a vacuum pump 346 is connected to the exhaust pipe 331 through a pressure detector such a pressure sensor 345 and a pressure regulator such as an auto pressure controller (APC) valve 342, and based on pressure information detected by the pressure sensor 345, the APC valve 342 is controlled so that the inside of the processing chamber 301 can be vacuum-evacuated to a predetermined pressure (vacuum degree). The APC valve 342 is an on-off valve configured to be opened and closed to start and stop vacuum evacuation of the inside of the processing chamber 301, and configured to be adjusted in valve opening degree for adjusting the inside pressure of the processing chamber 301.

At the lower side of the manifold 309, a seal cap 319 is installed as a furnace port cover capable of hermetically closing the opened bottom side of the manifold 309. The seal cap 319 is configured to be brought into contact with the manifold 309 in a vertical direction from the bottom side of the manifold 309. The seal cap 319 is made of a metal such as stainless steel and has a circular disk shape. On the top surface of the seal cap 319, an O-ring 320b is installed as a seal member configured to make contact with the bottom side of the manifold 309. At a side of the seal cap 319 opposite to the processing chamber 301, a rotary mechanism 367 is installed to rotate the boat 317 (described later). A rotation shaft 355 of the rotary mechanism 367 is inserted through the seal cap 319 and is connected to the boat 317, so as to rotate the wafers 2 by rotating the boat 317. The seal cap 319 is configured to be vertically moved by a boat elevator 315 which is disposed at the outside of the processing tube 303 as an elevating mechanism, and by this, the boat 317 can be loaded into and out of the processing chamber 301.

The boat 317 which is a substrate holding tool is made of a heat-resistant material such as quartz or silicon carbide and is configured to hold a plurality of wafers 2 in a state where the wafers 2 are horizontally positioned and arranged in multiple stages with the centers of the wafers 2 being aligned. At the lower part of the boat 317, an insulating member 318 made of a heat-resistant material such as quartz or silicon carbide is installed so as to prevent heat transfer from the heater 307 to the seal cap 319. In the processing tube 303, a temperature sensor 363 is installed as a temperature detector, and based on temperature information detected by the temperature sensor 363, power supplied to the heater 307 is controlled to obtain a desired temperature distribution in the processing chamber 301. Like the first nozzle 333a and the second nozzle 333b, the temperature sensor 363 is installed along the inner wall of the processing tube 303.

A controller 380 which is a control unit (control part) is configured to control operations of parts such as the APC valve 342, the heater 307, the temperature sensor 363, the vacuum pump 346, the rotary mechanism 367, the boat elevator 315, the valves vh1 to vh6, va1 to va6, and vo3 to vo6, the LMFCs 221h and 221a, and the MFCs 225h, 225a, 221o, 224h, 224a, and 224o.

Next, an explanation will be given on a substrate processing process for forming a thin film on a wafer 2 by an ALD method using the processing furnace 302 of the vertical ALD apparatus, as one of semiconductor device manufacturing processes. In the following description, each part of the vertical ALD apparatus is controlled by the controller 380.

A plurality of wafers 2 are charged into the boat 317 (wafer charging). Then, as shown in FIG. 7A, the boat 317 in which the plurality of wafers 2 are held is lifted and loaded into the processing chamber 301 by the boat elevator 315 (boat loading). In this state, the bottom side of the manifold 309 is sealed by the seal cap 319 with the O-ring 320b being disposed therebetween.

The inside of the processing chamber 301 is vacuum-evacuated by the vacuum pump 346 to a desired pressure (vacuum degree). At this time, the inside pressure of the processing chamber 301 is measured by the pressure sensor 345, and based on the measured pressure, the APC valve 342 is feedback-controlled. In addition, the inside of the processing chamber 301 is heated by the heater 307 to a desired temperature. At this time, so as to obtain a desired temperature distribution in the processing chamber 301, power supplied to the heater 307 is feedback-controlled based on temperature information detected by the temperature sensor 363. Then, the rotary mechanism 367 rotates the boat 317 to rotate the wafers 2.

Thereafter, like in the above-described embodiment, the Al$_2$O$_3$ film forming process S3 and the HfAlO film forming process S4 are performed in order to form Al$_2$O$_3$ films and HfAlO films on the wafers 2 to predetermined thicknesses.

After that, the boat elevator 315 lowers the seal cap 319 to open the bottom side of the manifold 309 and unload the boat 317 from the processing tube 303 through the opened bottom side of the manifold 309 in a state where the wafers 2 on which the Al$_2$O$_3$ films and the HfAlO films having predetermined thicknesses are formed are held in the boat 317 (boat unloading). Thereafter, the processed wafers 2 are discharged from the boat 317 (wafer discharging). Then, the processed wafers 2 are carried to a heat treatment apparatus, and a heat treatment process is performed on the wafers 2.

According to the current embodiment, the same effects as those obtained in the above-described embodiment can be obtained. That is, deterioration of electric characteristics caused by oxidation of a bottom electrode can be prevented. For example, a decrease in the capacitance of a capacitor can be prevented. In addition, through the heat treatment process, the HfAlO films can be doped with Al transferred from the $Al_2O_3$ films, and thus the Al concentration of the HfAlO films can be finely controlled and the permittivity of the HfAlO films can be controlled. Furthermore, the productivity of a semiconductor device can be increased.

Other Embodiments of the Invention

While the present invention has been particularly described with reference to the embodiments, the present invention is not limited to the embodiments, but various changes and modifications may be made in the present invention without departing from the scope of the invention.

For example, although a HfAlO film is formed as a high permittivity insulation film in the above-described embodiments, the present invention is not limited thereto. For example, the present invention may be properly applied to the cases where a high permittivity insulation film such as a $HfO_2$ film, a $ZrO_2$ film, a $TiO_2$ film, a $Nb_2O_5$ film, a $Ta_2O_5$ film, a SrTiO film, a BaSrTiO film, or a lead zirconate titanate (PZT) film is formed after an $Al_2O_3$ film is formed on the bottom electrode.

In addition, the present invention may be properly applied to the cases where $O_3$ gas or an oxygen-containing substance activated by plasma is used as an oxidizing precursor instead of using $H_2O$ gas as an oxidizing precursor. However, in the $Al_2O_3$ film forming process S3, to prevent oxidation of a bottom electrode, it is preferable that $H_2O$ be used as an oxidizing precursor. Since $H_2O$ has low oxidizing power as compared with the oxidizing power of $O_3$ or an oxygen-containing substance activated by plasma, during a film forming process, oxidizing of a bottom electrode can be effectively prevented by using $H_2O$ as an oxidizing precursor. On the other hand, since an $Al_2O_3$ film is formed on a bottom electrode as an oxidation preventing layer in the later HfAlO film forming process S4, although $O_3$ or an oxygen-containing substance activated by plasma is used as an oxidizing precursor, the bottom electrode may not be oxidized.

In addition, the present invention may be properly applied to the cases where a nitriding precursor (nitriding gas) is used instead of an oxidizing precursor and a high permittivity insulation film such as a HfAlN film, a
$HfO_2$ film, a $ZrO_2$ film, a $TiO_2$ film, a $Nb_2O_5$ film, a $Ta_2O_5$ film, a SrTiO film, a BaSrTiO film, or a PZT film is formed after a film having low oxygen permeability such as an aluminum nitride (AlN) film is formed on a bottom electrode.

Furthermore, in the above-described embodiments, a cluster type substrate processing apparatus is used, which includes a single wafer type cold wall apparatus as a first processing unit and a lamp heating type apparatus as a second processing unit. However, the present invention is not limited thereto. For example, the present invention may be properly applied to the cases of using a substrate processing apparatus or system which includes a single wafer type hot wall processing unit or a batch type hot wall processing unit. In addition, the present invention may be properly applied to the cases of using a substrate processing apparatus in which a filming forming process and a heat treatment process are performed in the same processing furnace.

Figure 13:
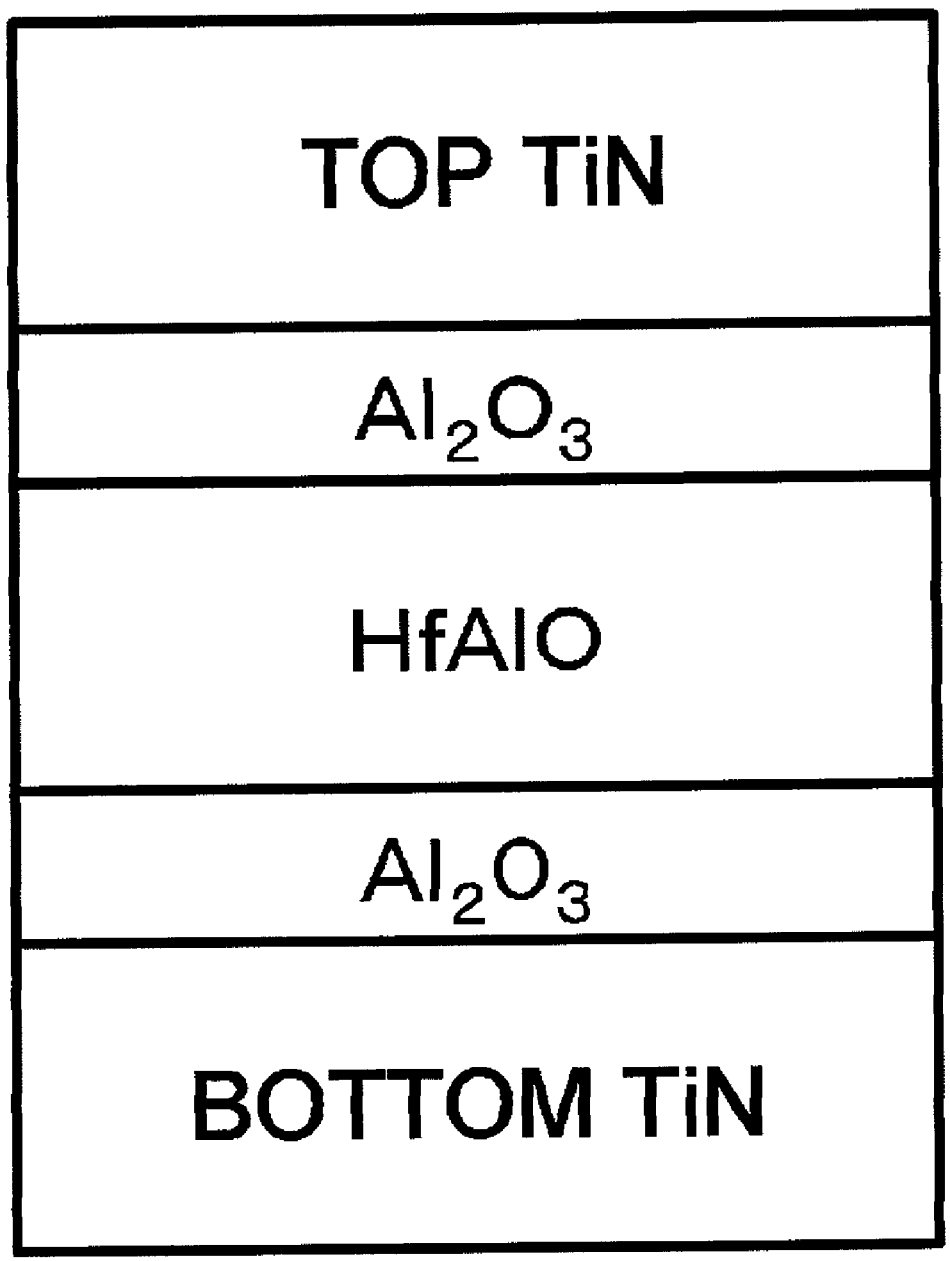
FIG. 13 is a sectional view illustrating an Al-containing $Al_2O_3$ film disposed between a top electrode (TiN) and a high permittivity insulation film (HfAlO) and another Al-containing $Al_2O_3$ film disposed between the high permittivity insulation film (HfAlO) and a bottom electrode (TiN).

Furthermore, in the above-described embodiments, an Al-containing insulation film ($Al_2O_3$ film) is formed between a bottom electrode (TiN film) and a high permittivity insulation film (HfAlO film). However, as shown in FIG. 13, another Al-containing insulation film ($Al_2O_3$ film) may also be formed between a top electrode (TiN film) and the higher permittivity insulation film (HfAlO film). In this case, for example, the following processes may be sequentially performed: forming a TiN film, forming a first $Al_2O_3$ film (hereinafter also referred to as a lower $Al_2O_3$ film), forming a HfAlO film on the first $Al_2O_3$ film, forming a second $Al_2O_3$ film (hereinafter also referred to as an upper $Al_2O_3$ film) on the HfAlO film, performing PDA, and forming a TiN film on the second $Al_2O_3$ film. Preferably, like the lower $Al_2O_3$ film, the upper $Al_2O_3$ film may be formed to a thickness of 0.1 nm to 0.3 nm.

In the structure shown in FIG. 13, as well as oxidation of the bottom electrode (TiN) being suppressed during the PDA process, oxidation of the top electrode (TiN) caused by a heat load to the HfAlO film can be suppressed when the top electrode (TiN) is formed or other processes are performed after the top electrode (TiN) is formed. In addition, during the PDA process, as well as the HfAlO film being doped with Al transferred from the lower $Al_2O_3$ film, the HfAlO film can also be doped with Al transferred from the upper $Al_2O_3$ film.

In this case, the total amount of Al doped in the HfAlO film after the PDA process is the sum of the amount of Al doped in the HfAlO film during the forming of the HfAlO film, the amount of Al transferred from the lower $Al_2O_3$ film to the HfAlO film during the PDA process, and the amount of Al transferred from the upper $Al_2O_3$ film to the HfAlO film during the PDA process. Therefore, by previously investigating the relationship between the Al doping amount and HfAlO film forming conditions in the HfAlO film forming process, the relationship between the Al doping amount from the lower $Al_2O_3$ film to the HfAlO film and PDA conditions in the PDA process, and the relationship between the Al doping amount from the upper $Al_2O_3$ film to the HfAlO film and PDA conditions in the PDA process, the Al concentration of the HfAlO film can be adjusted to a desired value after the PDA process. In the HfAlO film forming process or the PDA process, the doping amount of Al can be controlled in the same way as described in the previous embodiments.

As described above, according to the method of manufacturing a semiconductor device and the substrate processing system of the present invention, when a high permittivity insulation film is formed, oxidation of a metal film disposed under the high permittivity insulation film can be suppressed.

<Supplementary Note>

The present invention also includes the following embodiments.

According to an embodiment of the present invention, there is provided a method of manufacturing a semiconductor device, the method including:

forming an aluminum-containing insulation film on an electrode film formed on a surface of a substrate by alternately repeating a process of supplying an aluminum precursor into a processing chamber in which the substrate is accommodated and exhausting the aluminum precursor from the processing chamber and a process of supplying an oxidizing precursor or a nitriding precursor into the processing chamber and exhausting the oxidizing precursor or the nitriding precursor from the processing chamber;

forming a high permittivity insulation film different from the aluminum-containing insulation film on the aluminum-containing insulation film by alternately repeating a process of supplying a precursor into the processing chamber and exhausting the precursor from the processing chamber and a process of supplying an oxidizing precursor into the processing chamber and exhausting the oxidizing precursor from the processing chamber; and performing a heat treatment process to the substrate on which the high permittivity insulation film is formed.

Preferably, the aluminum-containing insulation film may be an aluminum oxide film or an aluminum nitride film.

Preferably, the aluminum-containing insulation film may be an aluminum oxide film having a thickness of 0.1 nm to 0.3 nm.

Preferably, the aluminum-containing insulation film may be an aluminum oxide film having a thickness of 0.1 nm to 0.2 nm.

Preferably, in the forming of the aluminum-containing insulation film, $H_2O$ may be used as the oxidizing precursor, and an aluminum oxide film may be formed as the aluminum-containing insulation film.

Preferably, in the forming of the high permittivity insulation film, $H_2O$, $O_3$, or an oxygen-containing substance activated by plasma may be used as the oxidizing precursor.

Preferably, in the performing of the heat treatment process, the high permittivity insulation film may be doped with Al transferred from the aluminum-containing insulation film.

Preferably, in the performing of the heat treatment process, an aluminum doping amount from the aluminum-containing insulation film to the high permittivity insulation film may be controlled by adjusting a heat treatment condition.

Preferably, in the performing of the heat treatment process, a heat treatment condition may be controlled so as to obtain a predetermined aluminum concentration in the high permittivity insulation film after the heat treatment process.

Preferably, the high permittivity insulation film may be a hafnium-containing or zirconium-containing film.

Preferably, the electrode film may be a TiN film, the aluminum-containing insulation film may be an $Al_2O_3$ film or an AlN film, and the high permittivity insulation film may be a HfAlO film, a $HfO_2$ film, a $ZrO_2$ film, a $TiO_2$ film, a $Nb_2O_5$ film, a $Ta_2O_5$ film, a SrTiO film, a BaSrTiO film, or a PZT film.

Preferably, the electrode film may be a TiN film, the aluminum-containing insulation film may be an $Al_2O_3$ film, and the high permittivity insulation film may be a HfAlO film, a $HfO_2$ film, or a $ZrO_2$ film.

Preferably, the electrode film may be a TiN film, the aluminum-containing insulation film may be an $Al_2O_3$ film, and the high permittivity insulation film may be a HfAlO film.

According to another embodiment of the present invention, there is provided a method of manufacturing a semiconductor device, the method including:
forming an aluminum-containing insulation film on an electrode film formed on a surface of a substrate;
forming a high permittivity insulation film different from the aluminum containing insulation film on the aluminum-containing insulation film; and performing a heat treatment on the substrate on which the high permittivity insulation film is formed.

According to another embodiment of the present invention, there is provided a substrate processing system including: a first processing unit; and a second processing unit,
wherein the first processing unit includes:
a processing chamber configured to process a substrate;
an aluminum precursor supply system configured to supply an aluminum precursor into the processing chamber;
a precursor supply system configured to supply a precursor into the processing chamber;
an oxidizing or nitriding precursor supply system configured to supply an oxidizing precursor or a nitriding precursor into the processing chamber;
an exhaust system configured to exhaust an inside of the processing chamber; and
a controller configured to control the aluminum precursor supply system, the precursor supply system, the oxidizing or nitriding precursor supply system, and the exhaust system, so as to: form an aluminum-containing insulation film on an electrode film formed on a surface of a substrate by alternately repeating a process of supplying an aluminum precursor into the processing chamber in which the substrate is accommodated and exhausting the aluminum precursor from the processing chamber and a process of supplying an oxidizing precursor or an nitriding precursor into the processing chamber and exhausting the oxidizing precursor or the nitriding precursor from the processing chamber; and form a high permittivity insulation film different from the aluminum-containing insulation film on the aluminum-containing insulation film by alternately repeating a process of supplying a precursor into the processing chamber and exhausting the precursor from the processing chamber and a process of supplying an oxidizing precursor into the processing chamber and exhausting the oxidizing precursor from the processing chamber, wherein the second processing unit is configured to perform a heat treatment on the substrate on which the high permittivity insulation film is formed.

What is claimed is:

1. A method of manufacturing a semiconductor device, the method comprising:
alternately repeating:
a process of supplying and exhausting an aluminum precursor into and from a processing chamber where the substrate is accommodated, and
a process of supplying and exhausting one of an oxidizing precursor and a nitriding precursor into and from the processing chamber to form an aluminum-containing insulation film on an electrode film formed on a surface of a substrate;
alternately repeating:
a process of supplying and exhausting a precursor into and from the processing chamber; and a process of supplying and exhausting an oxidizing precursor into and from the processing chamber to forming a high permittivity insulation film different from the aluminum-containing insulation film on the aluminum-containing insulation film; and
thermally diffusing aluminum in the aluminum-containing insulation film into the high permittivity insulation film by subjecting the substrate having the high permittivity insulation film thereon to a heat treatment process so as to dope the high permittivity insulation film.

2. The method of claim 1, wherein the aluminum-containing insulation film is one of an aluminum oxide film and an aluminum nitride film.

3. The method of claim 1, wherein the aluminum-containing insulation film is an aluminum oxide film having a thickness ranging from 0.1 nm to 0.3 nm.

4. The method of claim 1, wherein the aluminum-containing insulation film is an aluminum oxide film having a thickness ranging from 0.1 nm to 0.2 nm.

5. The method of claim 1, wherein the oxidizing precursor in the forming of the aluminum-containing insulation film is $H_2O$, and the aluminum-containing insulation film is an aluminum oxide film.

6. The method of claim 5, wherein the oxidizing precursor in the forming of the high permittivity insulation film is one of $H_2O$, $O_3$ and an oxygen-containing substance activated by plasma.

7. The method of claim 1, wherein an amount of the aluminum thermally diffused from the aluminum-containing insulation film into the high permittivity insulation film is controlled by adjusting a heat treatment condition of the heat treatment process.

8. The method of claim 1, wherein in the performing of the heat treatment process, a heat treatment condition is controlled so as to obtain a predetermined aluminum concentration in the high permittivity insulation film after the heat treatment process.

9. The method of claim 1, wherein the high permittivity insulation film is one of a hafnium-containing and zirconium-containing film.

10. The method of claim 1, wherein the electrode film is a TiN film, the aluminum-containing insulation film is one of an $Al_2O_3$ film and an AlN film, and the high permittivity insulation film is one of a HfAlO film, a $HfO_2$ film, a $ZrO_2$ film, a $TiO_2$ film, a $Nb_2O_5$ film, a $Ta_2O_5$ film, a SrTiO film, a BaSrTiO film and a PZT (lead zirconate titanate) film.

11. The method of claim 1, wherein the electrode film is a TiN film, the aluminum-containing insulation film is an $Al_2O_3$ film, and the high permittivity insulation film is one of a HfAlO film, a $HfO_2$ film and a $ZrO_2$ film.

12. The method of claim 1, wherein the electrode film is a TiN film, the aluminum-containing insulation film is an $Al_2O_3$ film, and the high permittivity insulation film is a HfAlO film.

13. A method of manufacturing a semiconductor device, the method comprising:
    forming an aluminum-containing insulation film on an electrode film formed on a surface of a substrate;
    forming a high permittivity insulation film different from the aluminum-containing insulation film on the aluminum-containing insulation film; and
    thermally diffusing aluminum in the aluminum-containing insulation film into the high permittivity insulation film by subjecting the substrate having the high permittivity insulation film thereon to a heat treatment process.

14. A substrate processing system comprising
a first processing unit and
a second processing unit,
wherein the first processing unit comprises:
    a first processing chamber configured to process a substrate;
    an aluminum precursor supply system configured to supply an aluminum precursor into the first processing chamber;
    a first precursor supply system configured to supply a precursor into the first processing chamber;
    a second precursor supply system configured to supply one of an oxidizing precursor and a nitriding precursor into the first processing chamber;
    an exhaust system configured to exhaust an inside of the first processing chamber; and
    a controller configured to control the aluminum precursor supply system, the first precursor supply system, the second precursor supply system and the exhaust system, so as to: alternately repeat a process of supplying and exhausting the aluminum precursor into and from the first processing chamber where the substrate is accommodated and a process of supplying and exhausting one of the oxidizing precursor and the nitriding precursor into and from the first processing chamber to form an aluminum-containing insulation film on an electrode film formed on a surface of a substrate; and alternately repeat a process of supplying and exhausting a precursor into and from the first processing chamber and a process of supplying and exhausting an oxidizing precursor into and from the first processing chamber to form a high permittivity insulation film different from the aluminum-containing insulation film on the aluminum-containing insulation film, and
wherein the second processing unit comprises:
a second processing chamber configured to process the substrate,
a heater configured to heat the substrate accommodated in the second processing chamber, and
a controller configured to control the heater so as to thermally diffuse aluminum in the aluminum-containing insulation film into the high permittivity insulation film by subjecting the substrate having the high permittivity insulation film thereon to a heat treatment process so as to dope the high permittivity insulation film.

15. The method of claim 1, further comprising:
forming an electrode film on the high permittivity insulation film after the heat treatment.

16. The method of claim 1, further comprising:
forming a second aluminum-containing insulation film on the high permittivity insulation film prior to the heat treatment by alternately repeating: a process of supplying and exhausting an aluminum precursor into and from a processing chamber where the substrate is accommodated; and a process of supplying and exhausting one of an oxidizing precursor and a nitriding precursor into and from the processing chamber; and
thermally diffusing aluminum in the second aluminum-containing insulation film into the high permittivity insulation film so as to dope the high permittivity insulation film by the heat treatment process.

17. The method of claim 16, further comprising:
forming an electrode film on the second aluminum-containing insulation film after the heat treatment.

18. The method of claim 13, further comprising:
forming a second aluminum-containing insulation film on the high permittivity insulation film prior to the heat treatment; and
thermally diffusing aluminum in the second aluminum-containing insulation film into the high permittivity insulation film by the heat treatment process so as to dope the high permittivity insulation film.

19. The method of claim 18, further comprising:
forming an electrode film on the second aluminum-containing insulation film after the heat treatment.

20. The method of claim 1, wherein a heat treatment condition of the heat treatment process is adjusted such that a concentration of the aluminum in the high permittivity insulation film ranges from 4% to 5%.

* * * * *